United States Patent
Hou et al.

(10) Patent No.: US 11,438,205 B2
(45) Date of Patent: Sep. 6, 2022

(54) ULTRA-WIDEBAND CREST FACTOR REDUCTION

(71) Applicant: TELEFONAKTIEBOLAGET LM ERICSSON (PUBL), Stockholm (SE)

(72) Inventors: Rui Hou, Täby (SE); Leonard Rexberg, Hässelby (SE); Bo Göransson, Sollentuna (SE); Richard Hellberg, Huddinge (SE); Mats Klingberg, Enebyberg (SE); Stefan Engström, Värmdö (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/052,330

(22) PCT Filed: May 24, 2019

(86) PCT No.: PCT/SE2019/050478
§ 371 (c)(1),
(2) Date: Nov. 2, 2020

(87) PCT Pub. No.: WO2019/231381
PCT Pub. Date: Dec. 5, 2019

(65) Prior Publication Data
US 2021/0176107 A1 Jun. 10, 2021

Related U.S. Application Data

(60) Provisional application No. 62/679,443, filed on Jun. 1, 2018.

(51) Int. Cl.
*H04L 27/26* (2006.01)
*H04B 1/04* (2006.01)
*H04L 25/03* (2006.01)

(52) U.S. Cl.
CPC ....... *H04L 27/2624* (2013.01); *H04B 1/0483* (2013.01); *H04L 25/03853* (2013.01)

(58) Field of Classification Search
CPC ............. H04L 27/2624; H04L 27/2623; H04L 25/03853; H04B 1/0483
See application file for complete search history.

(56) References Cited

U.S. PATENT DOCUMENTS 8,358,680 B2   1/2013  Morris et al.
2005/0232373 A1  10/2005  Peeters
(Continued)

OTHER PUBLICATIONS

Prepared by Eradala, "Technical Reporton Turbo Clipping," PB2;1 Ericsson Confidential Technical Report, Dec. 17, 2007, No. 1/0363-10/FCP 103 4475 Uen, pp. 1-83.
(Continued)

*Primary Examiner* — Sung S Ahn
(74) *Attorney, Agent, or Firm* — Patent Portfolio Builders PLLC

(57) ABSTRACT

Systems and methods for ultra-wideband Crest Factor Reduction (CFR) are provided. In some embodiments, a method performed by a wireless node for performing CFR includes performing a first CFR step on a plurality of input signals at a first sampling rate with joint peak detection and band-specific noise shaping; and performing a second CFR step on the resulting plurality of input signals at a second sampling rate with joint peak detection and joint noise shaping where the second sampling rate is higher than the first sampling rate. In this way, Peak-to-Average Power Ratio (PAPR) reduction may be increased while the computational complexity is reduced.

16 Claims, 17 Drawing Sheets

(56) References Cited

U.S. PATENT DOCUMENTS

| | | | |
|---|---|---|---|
| 2007/0201582 A1* | 8/2007 | Okada | H04L 5/06 375/308 |
| 2013/0215990 A1* | 8/2013 | Larionov | H04L 25/03834 375/285 |
| 2015/0349994 A1* | 12/2015 | Feng | H04L 27/2623 375/260 |
| 2016/0028574 A1* | 1/2016 | Wang | H04L 27/367 375/296 |
| 2017/0187560 A1* | 6/2017 | Ng | H04L 27/2623 |

OTHER PUBLICATIONS

Gauraw Kumar Srivastava et al., "Crest Factor Reduction for Carrier Aggregated OFDM Systems," Software, Telecommunications and Computer Networks (Softcom), 2012 20th International Conference on, IEEE, Sep. 11, 2012, 6 pages.

International Search Report/Written Opinion dated Aug. 19, 2019 in related/corresponding PCT Application No. PCT/SE2019/050478.

Seung Hee Han et al., "An Overview of Peak-to-Average Power Ratio Reduction Techniques for Multicarrier Transmission," Modulation, Coding and Signal Processing for Wireless Communications, IEEE Wireless Communications, Apr. 2005, pp. 56-65, vol. 12, No. 2.

* cited by examiner

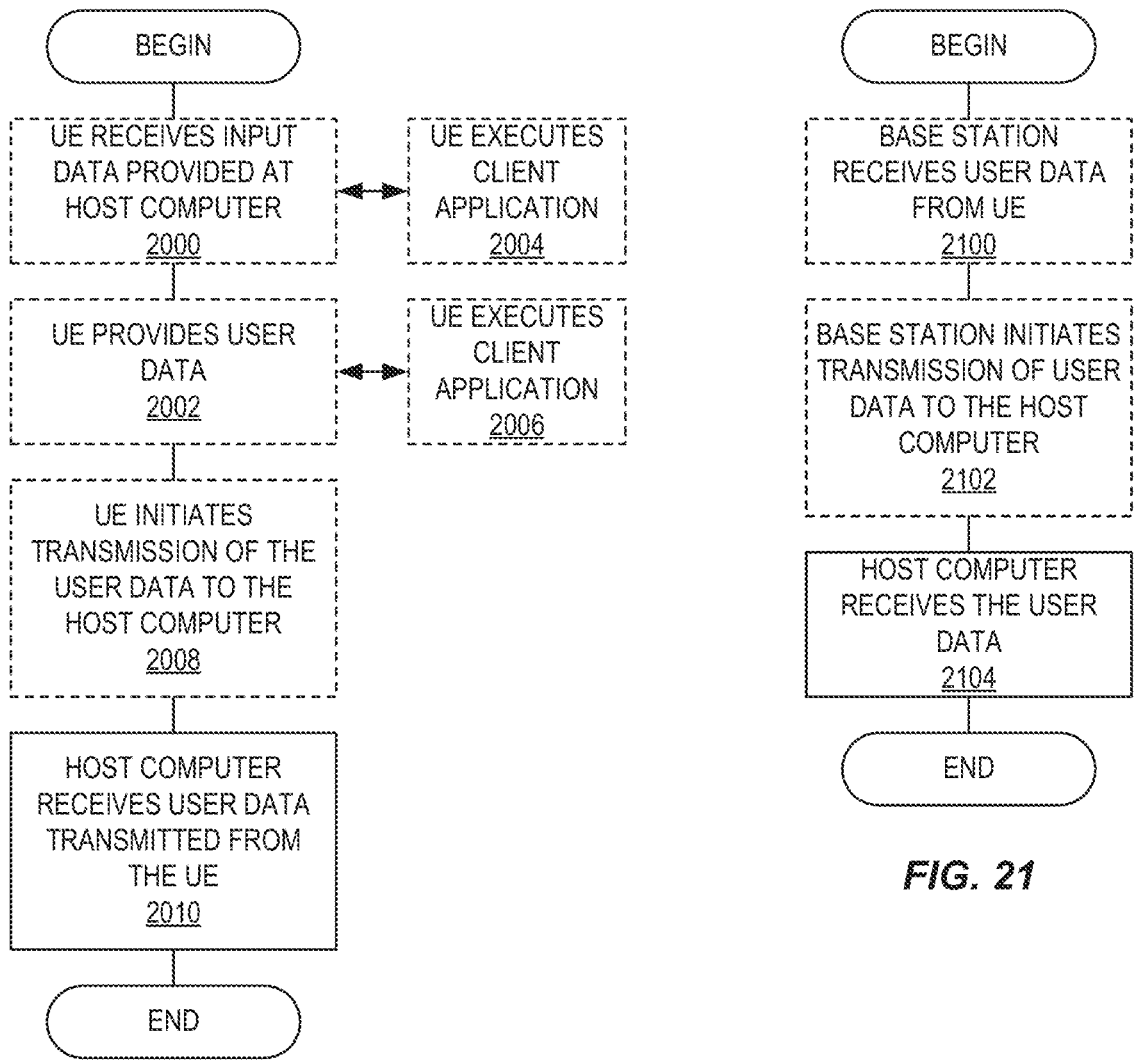

ULTRA-WIDEBAND CREST FACTOR REDUCTION

RELATED APPLICATIONS

This application is a U.S. National Stage Application of PCT/SE2019/050478 filed May 24, 2019, which claims the benefit of provisional patent application Ser. No. 62/679,443, filed Jun. 1, 2018, the disclosure of which is hereby incorporated herein by reference in its entirety.

TECHNICAL FIELD

The disclosure relates to performing Crest Factor Reduction (CFR) in a cellular communications network.

BACKGROUND

Modern communication systems such as Fourth Generation (4G)/Fifth Generation (5G) wireless networks employ Orthogonal Frequency Division Multiplexing (OFDM) to achieve spectrum efficiency. However, an OFDM signal has a high Peak-to-Average Power Ratio (PAPR), which is undesirable for the following reasons. First of all, a high PAPR causes the average transmission power to be significantly below the maximum power capacity of a transmitter, thereby limiting the communication range. Secondly, transmitters operating in such a deep power back-off often suffer from low energy efficiency. Due to these drawbacks, the PAPR of modern communication signals are often reduced by a signal processing procedure named Crest Factor Reduction (CFR).

CFR can be achieved by various techniques, such as clipping-filtering, coding, and tone-reservation (for an example, see S. H. Han and J. H. Lee, "An Overview Of Peak-To-Average Power Ratio Reduction Techniques For Multicarrier Transmission," IEEE Wireless Communications, vol. 12, no. 2, pp. 56-65, April 2005, incorporated herein by reference in its entirety). Since in practice, channel coding and modulation schemes cannot deviate from communication protocols, such as Long Term Evolution (LTE) or New Radio (NR), practical Radio Base Stations (RBSs) often employ clipping-filtering for CFR.

The clipping-filtering technique can be generically described by the following procedure. First, the amplitude peaks of an input signal above a certain threshold are extracted as the clipping noise. Second, the clipping noise is filtered to limit its spectral contents within certain frequency ranges. Third, the filtered clipping noise is subtracted from the original input signal, yielding an output with reduced PAPR. This procedure in its most general form is described in U.S. Patent Application Publication 2005/0232373 A1, by M. Peeters, entitled "Power Reduction," incorporated herein by reference in its entirety. In practice, it is the detailed implementation of this general procedure that distinguishes various CFR algorithms.

Most RBSs deployed today operate in a single band. The downlink Instantaneous Bandwidth (IBW) for Frequency Division Duplexing (FDD) bands seldom exceeds 100 Megahertz (MHz) as of today. In this case, it is theoretically optimal and practically feasible to clip the combined carriers within the IBW. In order to meet in-band emission requirements, channel filters are almost always deployed to filter the clipping noise so that it is confined within carrier bandwidths and never manifest itself elsewhere in the operating band.

With the advancement of Radio Frequency (RF) technology, concurrent multi-band RBSs emerged in recent years. Although each single-band occupies still a few tens of MHz up to around 100 MHz, the frequency distance between operating bands can easily be hundreds of MHz to a few Gigahertz (GHz). In this case, a straight-forward application of the single-band CFR technique becomes computationally expensive for the following reasons. Firstly, the sampling rate for the combined carriers needs to accommodate also the frequency distances between bands, which are orders of magnitudes larger than carrier bandwidth. Secondly, the channel filters for noise shaping purposes, with their transition edge roll-off defined in absolute frequency, becomes computationally expensive due to sharp transitions in the high sampling rate. Because of these issues, an alternative technique was proposed to operate the clipping and filtering at the single-band sampling rate. An example of this can be found in U.S. Pat. No. 8,358,680 by B. Morris and A. Fuller, entitled "Reducing Power Levels Associated with Two or More Signals Using Peak Reduction Distortion that is Derived from a Combined Signal," incorporated herein by reference in its entirety. In this technique, the carriers within each band are first combined, yielding amplitudes at single-band sampling rate. These amplitudes are summed up to estimate amplitude peaks of the combined bands. Then, these estimated peaks are clipped at the single-band sampling rate and the resulting clipping noise is filtered by channel filters at different bands separately. At last, the band specifically shaped clipping noise is subtracted from the band-specific signals accordingly. All these operations are performed at the single-band sampling rate to achieve CFR with controlled in-band emission. Improved systems and methods for performing CFR are needed.

SUMMARY

Systems and methods for ultra-wideband Crest Factor Reduction (CFR) are provided. In some embodiments, a method performed by a wireless node for performing CFR includes performing a first CFR step on a plurality of input signals at a first sampling rate with joint peak detection and band-specific noise shaping; and performing a second CFR step on the resulting plurality of input signals at a second sampling rate with joint peak detection and joint noise shaping where the second sampling rate is higher than the first sampling rate. In this way, Peak-to-Average Power Ratio (PAPR) reduction may be increased while the computational complexity is reduced.

In some embodiments, performing the band-specific noise shaping includes using one or more band-pass channel-filter banks. In some embodiments, performing the joint noise shaping includes using a band-stop filter bank. In some embodiments, the method also includes digitally upconverting the resulting plurality of input signals at the first sampling rate to produce the resulting plurality of input signals at the second sampling rate.

In some embodiments, each of the plurality of input signals comprises one carrier signal or multiple closely spaced carrier signals. In some embodiments, each of the multiple closely spaced carrier signals is at most 100 megahertz (MHz) away from the next closest carrier signal. In some embodiments, each of the plurality of input signals comprises a complex baseband signal of all carriers within a respective band. In some embodiments, the second sampling rate is higher than the entire frequency range of operation.

In some embodiments, performing the first CFR step includes obtaining the plurality of input signals; adding an envelope amplitude of each of the plurality of input signals to obtain a sum; comparing the sum to a first threshold and, when the sum is greater than the first threshold, calculating a scaling factor based on the sum and the first threshold; determining a respective clipping noise for each of the plurality of input signals based on the scaling factor; and filtering the clipping noise for each of the plurality of input signals with a respective band-pass channel-filter bank. In some embodiments, performing the first CFR step also includes adding the filtered clipping noise for each of the plurality of input signals to the plurality of input signals to produce the resulting plurality of input signals.

In some embodiments, performing the second CFR step includes obtaining an instantaneous amplitude of a multi-band signal created by the plurality of input signals; comparing the instantaneous amplitude to a second threshold and, when the instantaneous amplitude is greater than the second threshold, calculating an excess factor based on the instantaneous amplitude and the second threshold; determining a multi-band clipping noise based on the excess factor; and filtering the multi-band clipping noise with a band-stop filter bank. In some embodiments, performing the second CFR step also includes adding the filtered multi-band clipping noise to the multi-band signal to produce the resulting multi-band signal.

In some embodiments, a wireless node for performing CFR includes at least one processor and memory. The memory includes instructions executable by the at least one processor whereby the wireless node is operable to perform a first CFR step on a plurality of input signals at a first sampling rate with joint peak detection and band-specific noise shaping; and perform a second CFR step on the resulting plurality of input signals at a second sampling rate with joint peak detection and joint noise shaping where the second sampling rate is higher than the first sampling rate.

In some embodiments, a wireless node for performing CFR includes a first CFR module operable to perform a first CFR step on a plurality of input signals at a first sampling rate with joint peak detection and band-specific noise shaping; and a second CFR module operable to perform a second CFR step on the resulting plurality of input signals at a second sampling rate with joint peak detection and joint noise shaping where the second sampling rate is higher than the first sampling rate.

In some embodiments, the wireless node is a base station; a relay node; an In-the-Sky (ITS) radio access node; or a wireless device.

BRIEF DESCRIPTION OF THE DRAWINGS

The accompanying drawing figures incorporated in and forming a part of this specification illustrate several aspects of the disclosure, and together with the description serve to explain the principles of the disclosure.

FIGS. 18 through 21 are flowcharts illustrating methods implemented in a communication system, according to some embodiments of the present disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a NR base station (gNB) in a Third Generation Partnership Project (3GPP) 5G NR network or an enhanced or evolved Node B (eNB) in a 3GPP LTE network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell"; however, particularly with respect to 5G NR concepts, beams may be used instead of cells and, as such, it is important to note that the concepts described herein are equally applicable to both cells and beams.

Figure 1:
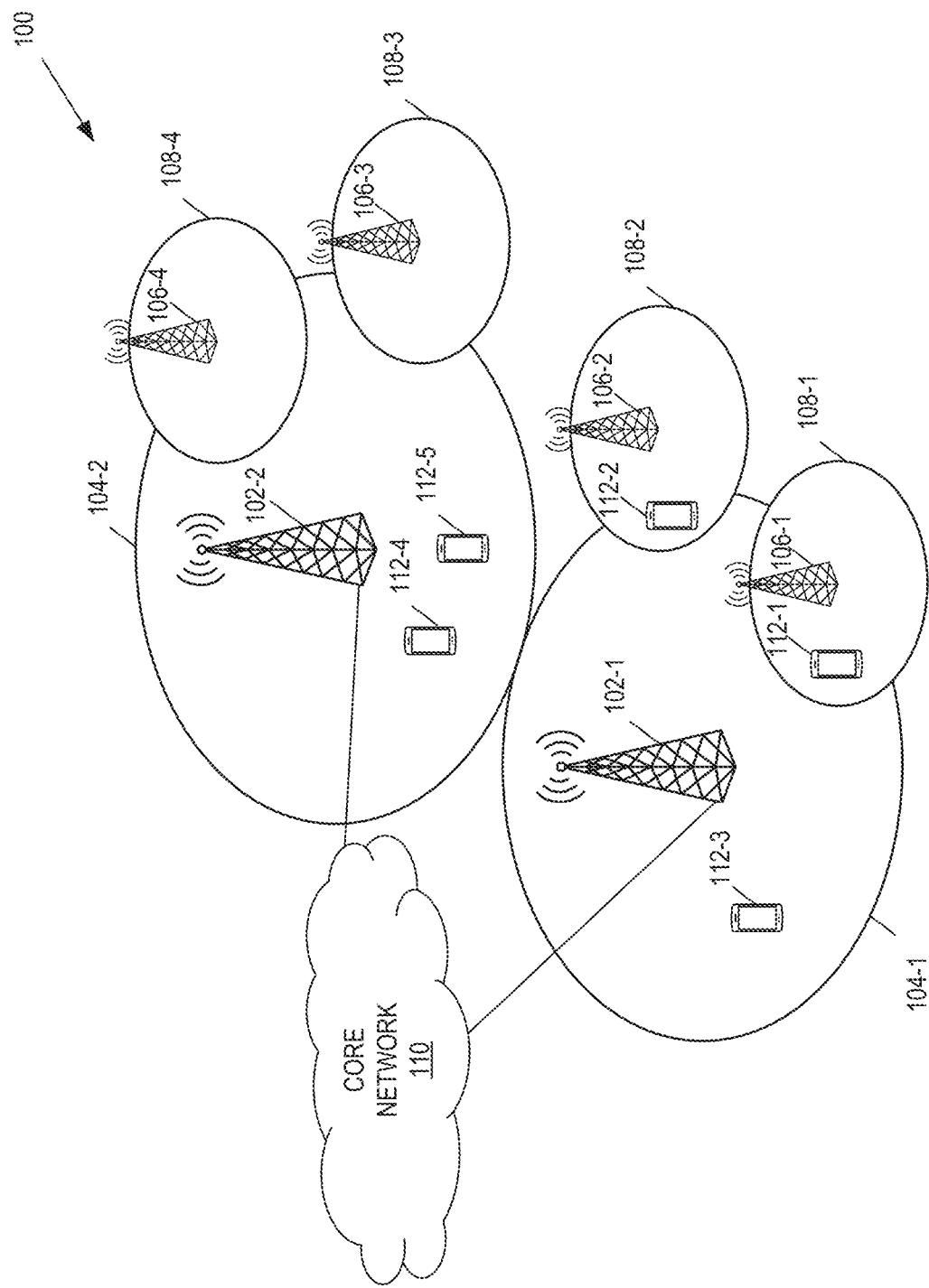
FIG. 1 illustrates one example of a cellular communications network, according to some embodiments of the present disclosure.

FIG. 1 illustrates one example of a cellular communications network 100 according to some embodiments of the present disclosure. In the embodiments described herein, the cellular communications network 100 is a 5G NR network. In this example, the cellular communications network 100 includes base stations 102-1 and 102-2, which in LTE are referred to as eNBs and in 5G NR are referred to as gNBs, controlling corresponding macro cells 104-1 and 104-2. The base stations 102-1 and 102-2 are generally referred to herein collectively as base stations 102 and individually as base station 102. Likewise, the macro cells 104-1 and 104-2 are generally referred to herein collectively as macro cells 104 and individually as macro cell 104. The cellular communications network 100 may also include a number of low power nodes 106-1 through 106-4 controlling corresponding small cells 108-1 through 108-4. The low power nodes 106-1 through 106-4 can be small base stations (such as pico or femto base stations) or Remote Radio Heads (RRHs), or the like. Notably, while not illustrated, one or more of the small cells 108-1 through 108-4 may alternatively be provided by the base stations 102. The low power nodes 106-1 through 106-4 are generally referred to herein collectively as low power nodes 106 and individually as low power node 106. Likewise, the small cells 108-1 through 108-4 are generally referred to herein collectively as small cells 108 and individually as small cell 108. The base stations 102 (and optionally the low power nodes 106) are connected to a core network 110.

The base stations 102 and the low power nodes 106 provide service to wireless devices 112-1 through 112-5 in the corresponding cells 104 and 108. The wireless devices 112-1 through 112-5 are generally referred to herein collectively as wireless devices 112 and individually as wireless device 112. The wireless devices 112 are also sometimes referred to herein as UEs.

Figure 2:
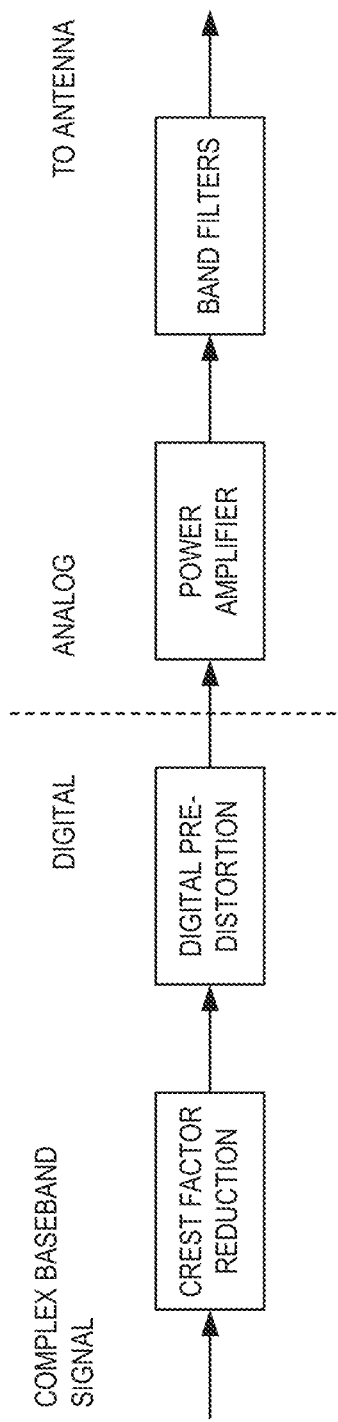
FIG. 2 illustrates an example Crest Factor Reduction (CFR) functionality within a typical transmitter, according to some embodiments of the present disclosure.

The CFR functionality within a typical transmitter in an RBS is illustrated in FIG. 2. The complex baseband signal is processed sequentially by the CFR, the Digital Predistortion (DPD), the Power Amplifier (PA), and band filters and goes to the antenna. The CFR reduces the PAPR of the signal. The DPD compensates for the distortion in the PA so that the input-output relation of the DPD-PA cascade is ideally linear. This linearity ensures that the PA output resembles the CFR output with high fidelity and has also a reduced PAPR accordingly. The band filters are RF bandpass filters that pass all in-band signals through and block all out-of-band signals from going into the antenna.

The advancement of RF technology enables RBSs to operate at multiple bands with an IBW over 2 GHz. A straight-forward application of the single-band technique (as included in e.g., U.S. Pat. No. 8,358,680 by B. Morris and A. Fuller, entitled "Reducing Power Levels Associated with Two or More Signals Using Peak Reduction Distortion that is Derived from a Combined Signal") would be prohibitively expensive, in terms of both hardware cost and power consumption for the following reasons:

1. Despite the low single-band sampling rates, the sampling rate of the entire IBW is extremely high in order to accommodate vastly unused frequency spacing between bands. In such a high sampling rate, the transition edges of channel filters become extremely sharp. This implies very long impulse responses in the time domain and thus expensive convolutions to calculate.
2. In the time domain, the clipped peaks for widely placed bands are very sharp whereas the channel filters are very long. The filtering operation smears out sharp spikes (of a few samples in length) into a long cancelling pulse (of thousands of samples in length). Peak cancellation in this way yields considerable peak regrowth after each clipping-filtering iteration and requires many iterations to converge, at best. The risk of divergence (i.e., PAPR increases instead of decreases after each iteration) is significant.

Both problems can be solved by the multi-band technique discussed above since the sampling rate of operation only accommodates single bands. Therefore, the vast frequency spacing between bands becomes irrelevant to the computational complexity. However, the low sampling rate also causes problems:

1. Multi-band signals, when combined, have intrinsically sharp spikes to be clipped. The sharpness is positively correlated to the frequency spacing of the concurrent bands. Therefore, a slow sampling rate is intrinsically incapable of capturing these sharp spikes.
2. Due to the incapability of representing sharp spikes in a low sampling rate, clipping the true spikes would inevitably also clip the neighboring time locations too close to these spikes to be distinguished in the low sampling rate. This over-clipping causes a penalty in Error Vector Magnitude (EVM). The more bands in operation, the more of an EVM penalty it causes. In practice, certain EVM requirements have to be satisfied, implying that the achievable PAPR reduction has to be compromised accordingly.

Certain aspects of the present disclosure and their embodiments may provide solutions to the aforementioned or other challenges. Systems and methods for performing CFR are provided. In some embodiments, a method performed by a transmitter for performing CFR includes performing a first CFR step on a plurality of input signals at a first sampling rate with joint peak detection and band-specific noise shaping and performing a second CFR step on the resulting plurality of input signals at a second sampling rate with joint peak detection and joint noise shaping where the second sampling rate is higher than the first sampling rate.

In some embodiments, multi-band signals are clipped and filtered in two steps.

Step 1: signals at each band are clipped when their amplitude summation exceeds a certain threshold. This clipping operates at a low sampling rate, and the band-specific clipping noise is constrained within channel bandwidths by band-specific channel filters.

Step 2: The combined multiband signal is clipped when its amplitude exceeds a certain threshold. This clipping operates at a high sampling rate, and the clipping noise is expelled from all bands by band-stop filters. As such, the clipping noise is efficiently distributed within carriers and outside of operating bands in order to achieve optimal EVM versus PAPR performance without compromising in-band emission requirement. Moreover, the sharp channel filters at the low sampling rate and relaxed band-stop filters at the high sampling rate reduce the computational complexity.

A CFR method for multiple bands comprises:

A first step running at a low sampling rate with joint peak detection and band-specific noise shaping by band-pass channel-filter banks.

A second step running at a high sampling rate with joint peak detection and joint noise shaping by a band-stop filter bank.

Figure 3:
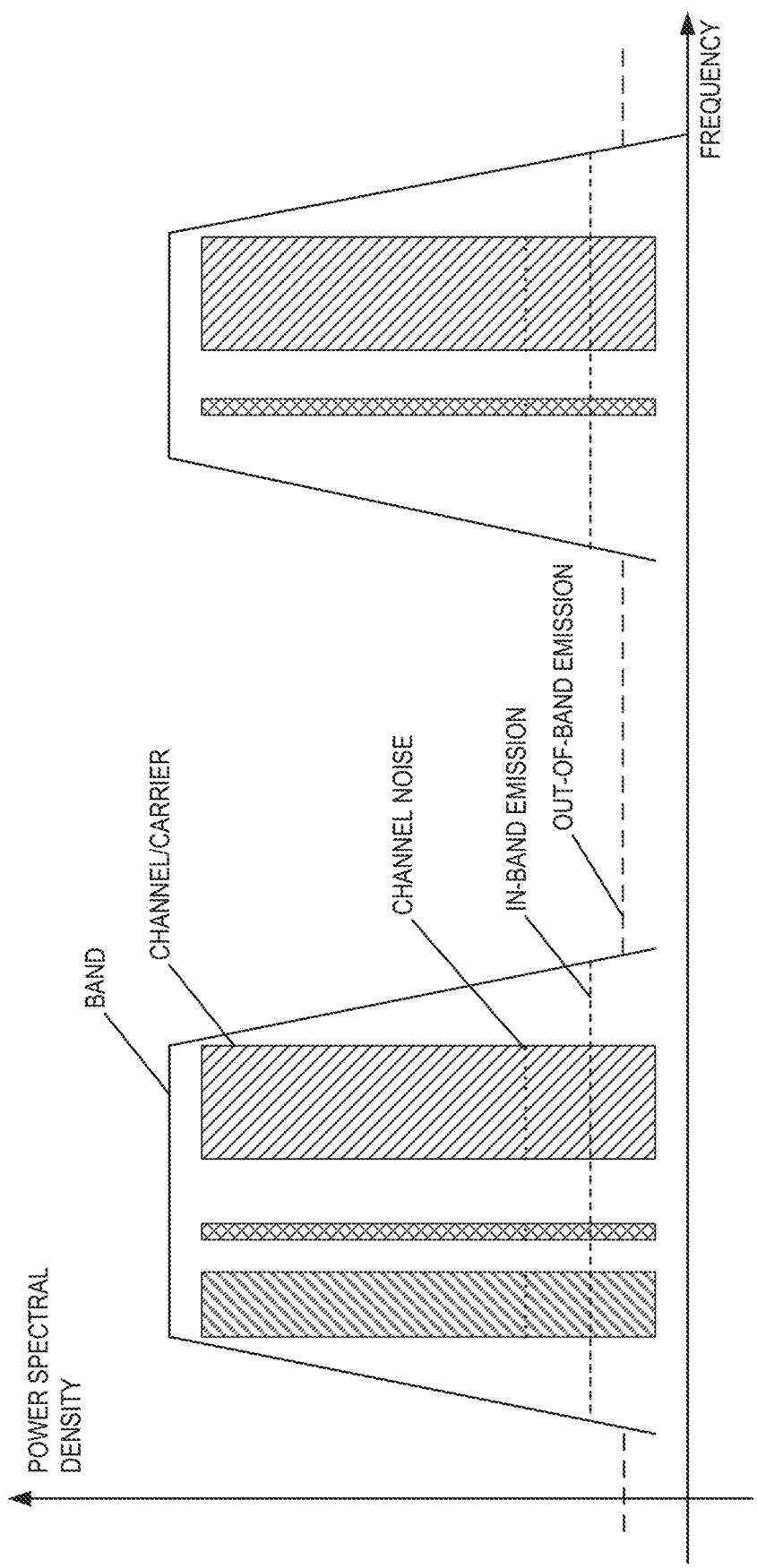
FIG. 3 illustrates an example spectrum of a signal going into the antenna, according to some embodiments of the present disclosure.

The spectrum of the signal going into the antenna is illustrated in FIG. 3. The entire operating frequency range consists of multiple bands. Transmissions are only permitted within the operating bands by means of modulated carriers. Each carrier is also named a channel. To utilize the spectrum efficiently and also to prevent inter-carrier interference, the frequency content of a carrier is confined by a channel filter with sharp transition edges, e.g. tens of dB within a few hundreds of Kilohertz (kHz). For the same reason, operating bands are also filtered by RF band-pass filters with sharp roll-off at the band edges. At low GHz frequencies, the RF band-pass filters could have tens of decibels (dBs) of roll-off within a few MHz.

Since CFR clips the time-domain peaks of originally ideal baseband signals, these clipped peaks show up in the frequency domain as broadband noise, hereafter referred to as "clipping noise." Clipping noise needs to be in tight control to comply with regulatory requirements. As shown in FIG. 3, different requirements apply to clipping noise depending on its frequency location. Clipping noise within channels introduces transmission errors, which need to be below a certain EVM criterion for a certain communication protocol. Clipping noise outside of the channels but within bands could interfere with other channels, and thus its power spectral density needs to be below a certain level, often specified as the in-band emission requirement. Likewise, clipping noise outside of the band has to satisfy out-of-band emission requirements.

To comply with the aforementioned EVM in-band and out-of-band emission requirement, to effectively reduce the PAPR of multi-carrier multi-band signals, and also to operate with low computational complexity, especially for the common case of sparse multi-band applications, i.e., the frequency spacing between bands are much larger than the bandwidths of carriers, some embodiments are disclosed herein for performing CFR.

Figure 4:
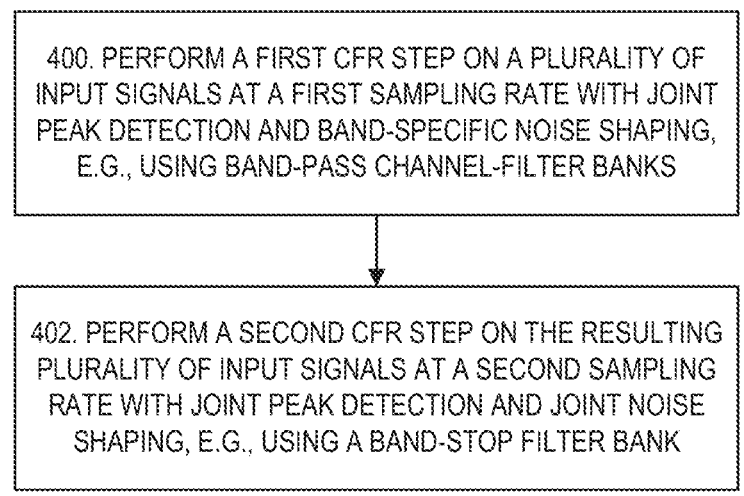
FIG. 4 illustrates a method for operating a transmitter for performing CFR, according to some embodiments of the present disclosure.

FIG. 4 illustrates a method for operating a transmitter for performing CFR. As discussed above, this transmitter may be part of an RBS such as a radio access node, for example, a base station 102 or 106. In some embodiments, this transmitter may be part of a UE such as a wireless device 112. The method includes a transmitter performing a first CFR step on a plurality of input signals at a first sampling rate with joint peak detection and band-specific noise shaping (step 400). The method also includes performing a second CFR step on the resulting plurality of input signals at a second sampling rate with joint peak detection and joint noise shaping where the second sampling rate is higher than the first sampling rate (step 402).

Some embodiments disclosed herein may provide the following technical advantage: maximized PAPR reduction. The extent of PAPR reduction depends on the extent of clipping noise preservation by filtering. The proposed approach maximally preserves the clipping noise, not only within channel bandwidths but also outside operating bands. This maximal clipping noise preservation minimizes the resulting PAPR without compromising the EVM and in-band emission requirements.

Some embodiments disclosed herein may provide the following technical advantage: minimized computational complexity.

The noise shaping is performed in two steps, namely band-pass channel filters and band-stop band filters. Channel filters have very sharp transition edges (in terms of Decibels (dB)/Hertz (Hz)) but are running at a low sampling rate. In contrast, band-stop filters have much more relaxed transition edges (in terms of dB/Hz) to operate at a high sampling rate. As such, clipping noise is optimally shaped both within and out of bands at computation rates optimized for the filtering complexity.

In some embodiments, in order to transform the signals from the first sampling rate to the higher second sampling rate, the method also includes digitally upconverting the resulting plurality of input signals at the first sampling rate to produce the resulting plurality of input signals at the second sampling rate. Additional details for some embodiments are discussed below.

In some embodiments, performing band-specific noise shaping comprises using one or more band-pass channel-filter banks. In some embodiments, performing joint noise shaping comprises using a band-stop filter bank.

In some embodiments, the method also includes digitally upconverting the resulting plurality of input signals at the first sampling rate to produce the resulting plurality of input signals at the second sampling rate.

In some embodiments, each of the plurality of input signals comprises one carrier signal or multiple closely spaced carrier signals. In some embodiments, each of the plurality of input signals comprises a complex baseband signal of all carriers within a respective band. In some embodiments, the second sampling rate is higher than the entire frequency range of operation.

In some embodiments, performing the first CFR step comprises obtaining the plurality of input signals; adding an envelope amplitude of each of the plurality of input signals to obtain a sum; comparing the sum to a first threshold and, when the sum is greater than the first threshold, calculating a scaling factor based on the sum and the first threshold; determining a respective clipping noise for each of the plurality of input signals based on the scaling factor; and filtering the clipping noise for each of the plurality of input signals with a respective band-pass channel-filter bank.

In some embodiments, performing the second CFR step comprises obtaining an instantaneous amplitude of a multi-band signal created by the plurality of input signals; comparing the instantaneous amplitude to a second threshold and, when the instantaneous amplitude is greater than the second threshold, calculating an excess factor based on the instantaneous amplitude and the second threshold; determining a multi-band clipping noise based on the excess factor; and filtering the multi-band clipping noise with a band-stop filter bank.

In some embodiments, the amount of clipping in the two stages can be varied depending on the configuration of, and/or the power in, the bands. For example, it can be advantageous to reduce the amount of clipping in the first stage if the clipping noise for the total signal (e.g., the second stage) falls outside the bands to a large extent. This might occur to a larger extent when more bands are active at the same time. In this case, more of the peak reduction can be achieved by the second stage. This is advantageous since there will be less noise in the channels, which means that higher data rates (higher number of bits per symbol) can be achieved. In some embodiments, the reduced clipping in the first stage can be achieved by either raising the clipping threshold and/or reducing the amount of clipped, filtered signal that is reinserted.

Figure 5:
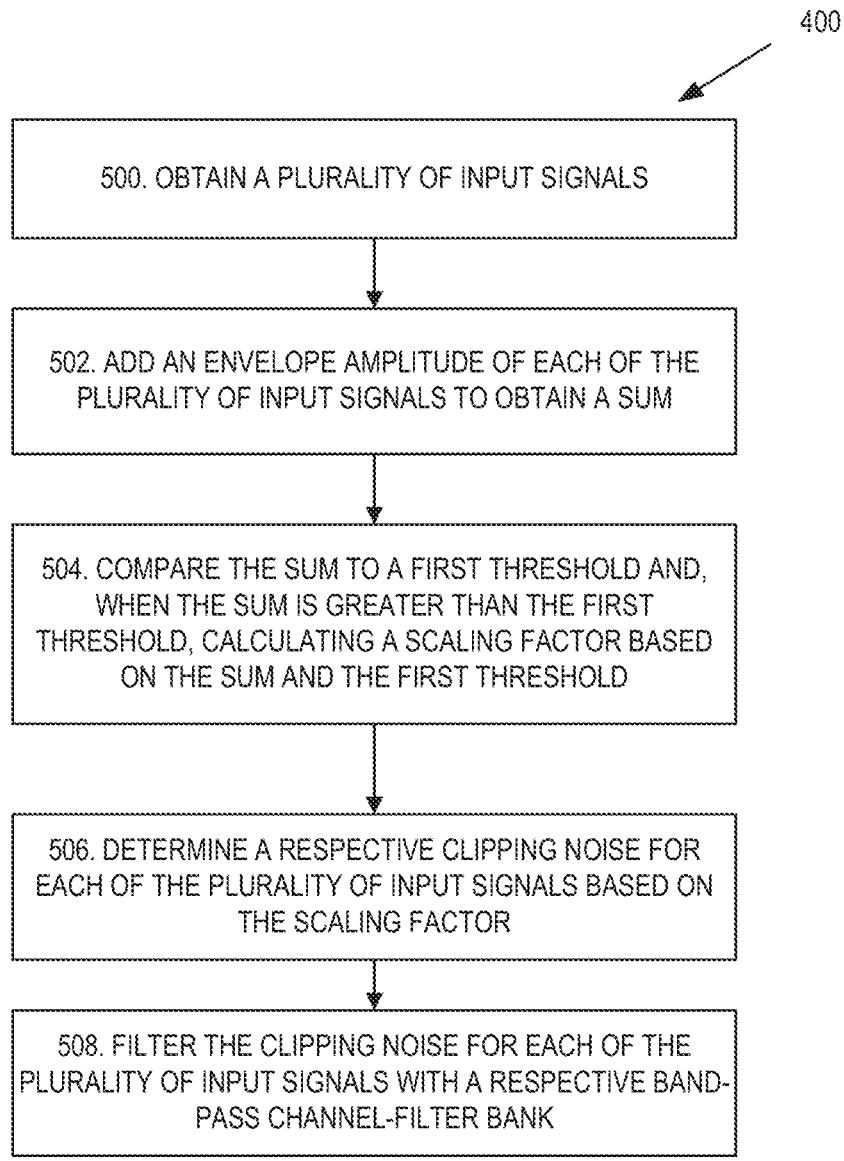
FIG. 5 illustrates one example implementation of the first CFR step shown above in FIG. 4, according to some embodiments of the present disclosure.
Figure 6:
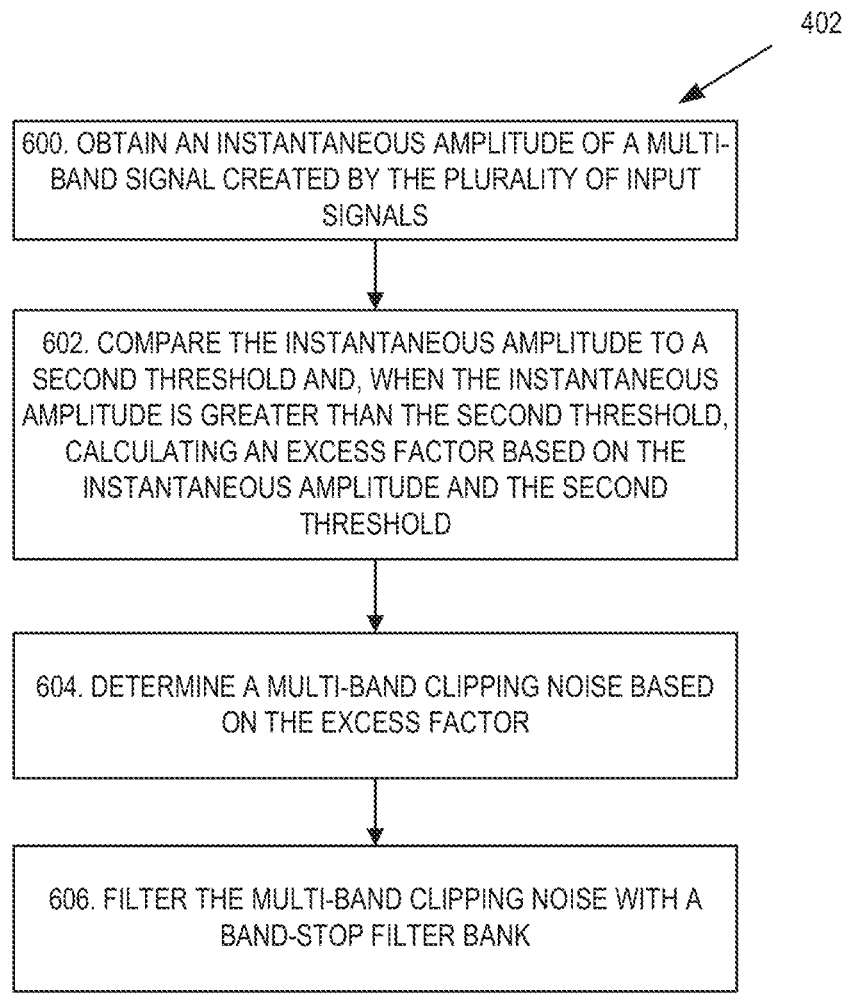
FIG. 6 illustrates one example implementation of the second CFR step shown above in FIG. 4, according to some embodiments of the present disclosure.

FIGS. 5 and 6 illustrate additional details of steps 400 and 402, respectively, according to some embodiments. FIG. 5 illustrates one example implementation of the first CFR step shown above in step 400. This method includes obtaining the plurality of input signals (step 500) and adding an envelope amplitude of each of the plurality of input signals to obtain a sum (step 502). The method then includes comparing the sum to a first threshold and, when the sum is greater than the first threshold, calculating a scaling factor based on the sum and the first threshold (step 504). A respective clipping noise is then determined for each of the plurality of input signals based on the scaling factor (step 506) and the clipping noise for each of the plurality of input signals is filtered with a respective band-pass channel-filter bank (step 508). Additional details for some embodiments are discussed below.

FIG. 6 illustrates one example implementation of the second CFR step shown above in step 402. This method includes obtaining an instantaneous amplitude of a multi-band signal created by the plurality of input signals (step 600), comparing the instantaneous amplitude to a second threshold and, when the instantaneous amplitude is greater than the second threshold, calculating an excess factor based on the instantaneous amplitude and the second threshold (step 602). The method also includes determining a multi-band clipping noise based on the excess factor (step 604) and filtering the multi-band clipping noise with a band-stop filter bank (step 606). Additional details for some embodiments are discussed below.

Figure 7:
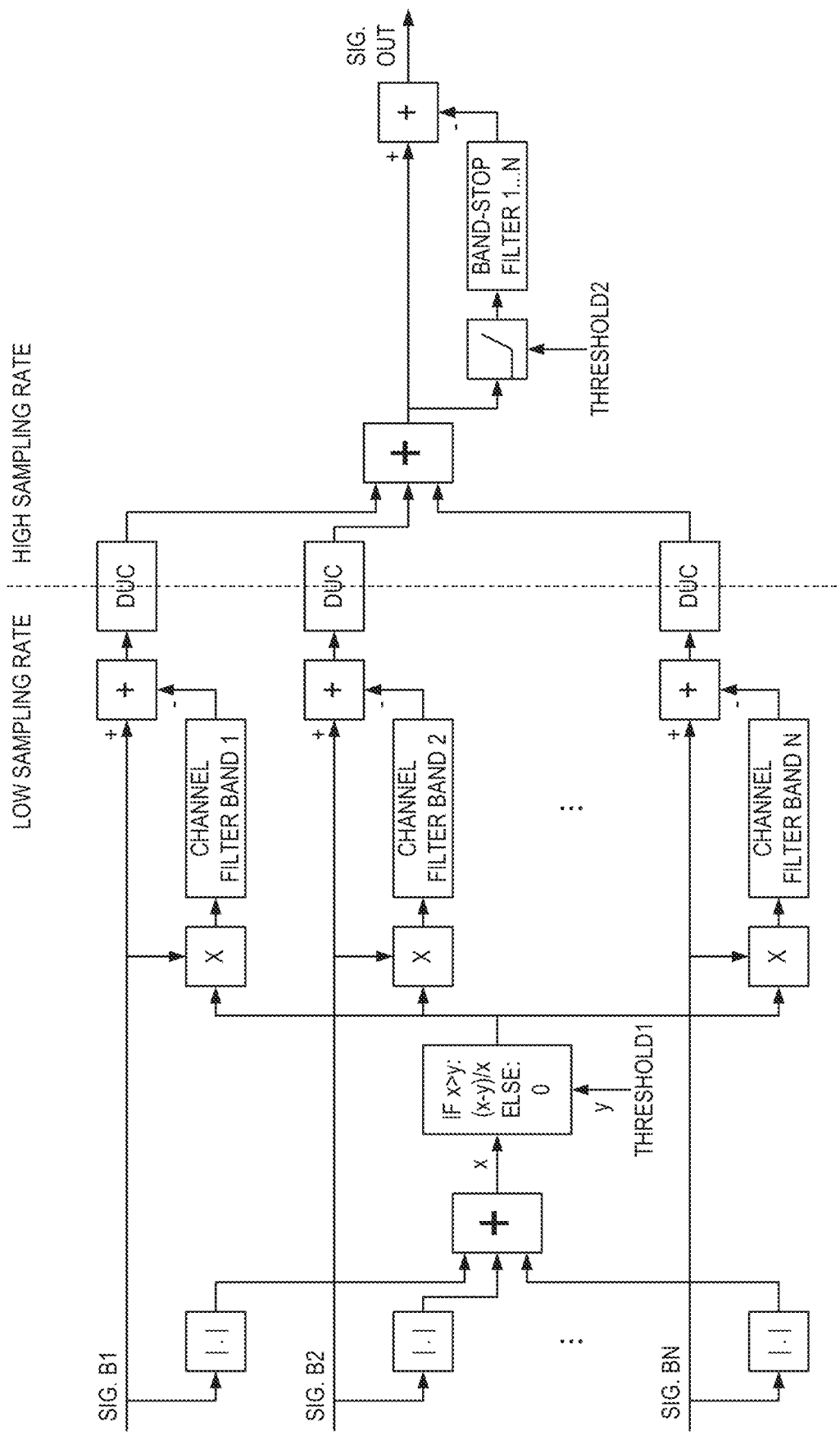
FIG. 7 illustrates an exemplary implementation of the method discussed in relation to FIG. 4, according to some embodiments of the present disclosure.

FIG. 7 illustrates an exemplary implementation of the method discussed in relation to FIG. 4. As shown in the block diagram, this embodiment of performing CFR consists of two steps:

a. Step 1 operates at a low sampling rate before the Digital Upconversion (DUC). This is sometimes referred to herein as the first CFR step; and b. Step 2 operates at a high sampling rate after the DUC. This is sometimes referred to herein as the second CFR step.

Step 1 takes as input N input signals. In some embodiments, each one of these N signals consists of one carrier or multiple closely spaced carriers. For example, each input signal can be the complex baseband signal consisting of all carriers within a single band. For the remainder of this disclosure, these separate signals will be discussed as though they correspond to separate bands. However, this is merely for convenience and the current disclosure is not limited thereto. In some embodiments, these input signals could be individual carriers or any suitably grouped set of carriers. For instance, a large band that includes four carriers could be grouped as one, two, three, or four input signals. In some embodiments, the sampling rate of these single-band signals should be higher but preferably not much higher than the single-band bandwidth.

As shown in FIG. 7, the clipping in Step 1 starts by adding the envelope amplitude of all the input signals. This sum is compared with a first threshold (i.e., Threshold 1 in FIG. 7). If the total amplitude is higher than this threshold by an excess, the ratio of this excess over the total amplitude is calculated as a scaling factor to scale each input signal, yielding the clipping noise for each band. If the total amplitude is lower than Threshold 1, the clipping noise will be zero. For each band, the clipping noise is filtered by its specific channel-filter bank, so that the clipping noise is confined within the channels as the channel noise shown in FIG. 3. The band-specific channel noise is then subtracted from the input signals to finish Step 1, the low sampling-rate CFR.

In some embodiments, after the band-specific CFR, the signals of each band go through a DUC to be up-sampled and up-shifted to the RF frequency of operation. Then all the band-specific signals are summed together, yielding the combined multi-band signal at a high sampling rate that is at least higher than the entire RF frequency range of operation (i.e., from the lower band edge of the lowest-frequency band to the upper band edge of the highest-frequency band).

In Step 2 of this embodiment, the instantaneous amplitude of this high sampling-rate multi-band signal is compared to a second threshold (i.e., Threshold 2 in FIG. 7) to calculate the multi-band clipping noise. If the multi-band signal has an amplitude that is lower than Threshold 2, the clipping noise will be zero. On the other hand, if the amplitude of the multi-band signal is higher than Threshold 2, the excessive portion will be the clipping noise. After that, the clipping noise is passed through a band-stop filter bank, which attenuates the clipping noise in all the operating bands sufficiently to satisfy the in-band emission requirement, as shown in FIG. 3. The clipping noise falling in between the operating bands is allowed to pass this filter and is subtracted from the multi-band signal, accomplishing Step 2, the high sampling-rate CFR.

The signal after the proposed embodiment of performing CFR will pass through a DPD and a PA, as shown in FIG. 2, yielding a PA output with reduced PAPR, therefore fulfilling its purpose. In some embodiments, the clipping noise generated in Step 2, in between the operating bands, is subsequently removed by the RF band-pass filter banks as shown in FIG. 2, in order to fulfill the out-of-band emission requirements shown in FIG. 3.

The filters discussed herein may be implemented as either digital or analog filters, or some combination of the two. For instance, analog filter implementation technologies (L-C (Inductor-Capacitor), active, cavity, etc.) may be especially useful in the second stage filters since these signals can be very wideband. In such a situation where the first stage uses digital filters and the second stage uses analog filters, the Digital-to-Analog Converter (DAC) or DACs will then be placed between stage one and two.

Embodiments disclosed herein may have the following distinguished advantages. First, compared with current multi-band CFR implementations, e.g., the methods discussed above, the proposed technique utilizes the clipping noise not only within channels but also in between operating bands, thereby further reducing PAPR. Also, in some embodiments, compared with previous CFR techniques, the proposed technique performs the clipping noise shaping in two steps. In some embodiments, these two steps are bandpass channel-filter-banks with sharp transitions running at a low sampling rate and a band-stop filter-bank with gradual transitions running at a high sampling rate. As such, this two-step approach reduces the computational complexity compared with any single-step filtering approach. The reduction in computation is especially significant in practice, where channels can be only a few MHz wide but are separated by hundreds of MHz.

For a demonstration of the effectiveness and advantages of the embodiments of the current disclosure, a practical application is described in the following text. A multi-band signal is generated with one 20 MHz LTE signal at band center for each of:
  a. Band 20 (791-821 MHz),
  b. Band 8 (925-960 MHz),
  c. Band 3 (1805-1880 MHz),
  d. Band 1 (2110-2170 MHz), and
  e. Band 7 (2620-2690 MHz).

The entire signal is 0.5 milliseconds (ms) long (one LTE slot). The sampling rate at the input of FIG. 7 is 30.72 MS/s. Since amplitude spikes can happen in between samples, the clipping noise generation is running at four times oversampling rate. The total amplitude is compared with Threshold 1 at 8.85 dB above the average power level to calculate the clipping noise in Step 1. The clipping noise is filtered by 20 MHz channel filters with 127 taps running at 30.72 MHz. Since filtering removes parts of the clipping noise, yielding peak regrowth, Step 1 is iterated for two times. After that, the DUCs up-sample each band up to 2457.6 MS/s and shift them to their corresponding RF frequencies. This combined signal is passed through Step 2 CFR, again with four times oversampling to account for peaks in between samples and two iterations to tackle peak regrowth. The clipping threshold, Threshold 2, is set to 6 dB above the average power level.

Figure 8:
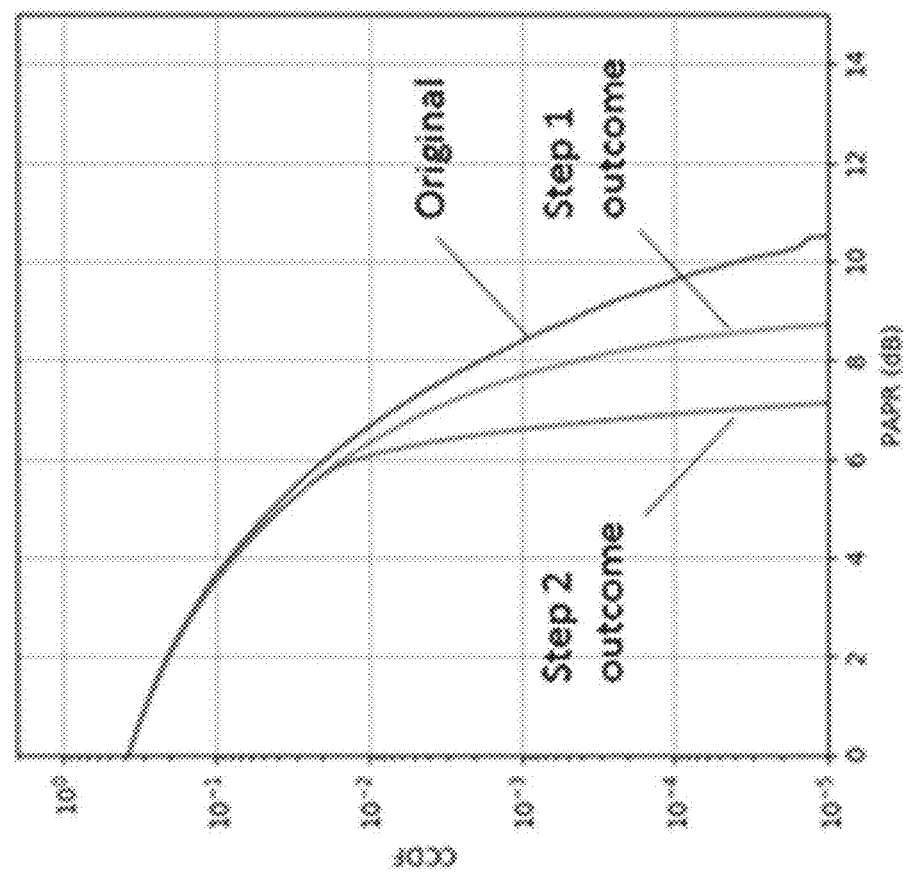
FIG. 8 illustrates an original signal, an intermediate result after Step 1, and a final result after Step 2, according to some embodiments of the present disclosure.
Figure 8:
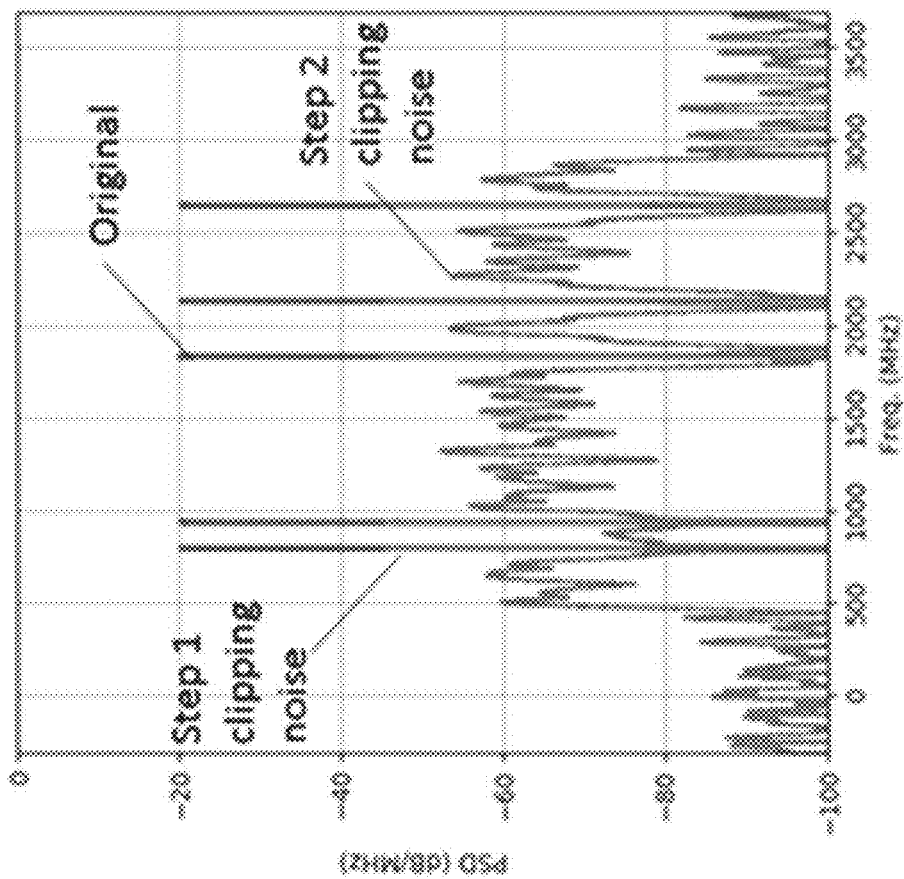
Figure 9:
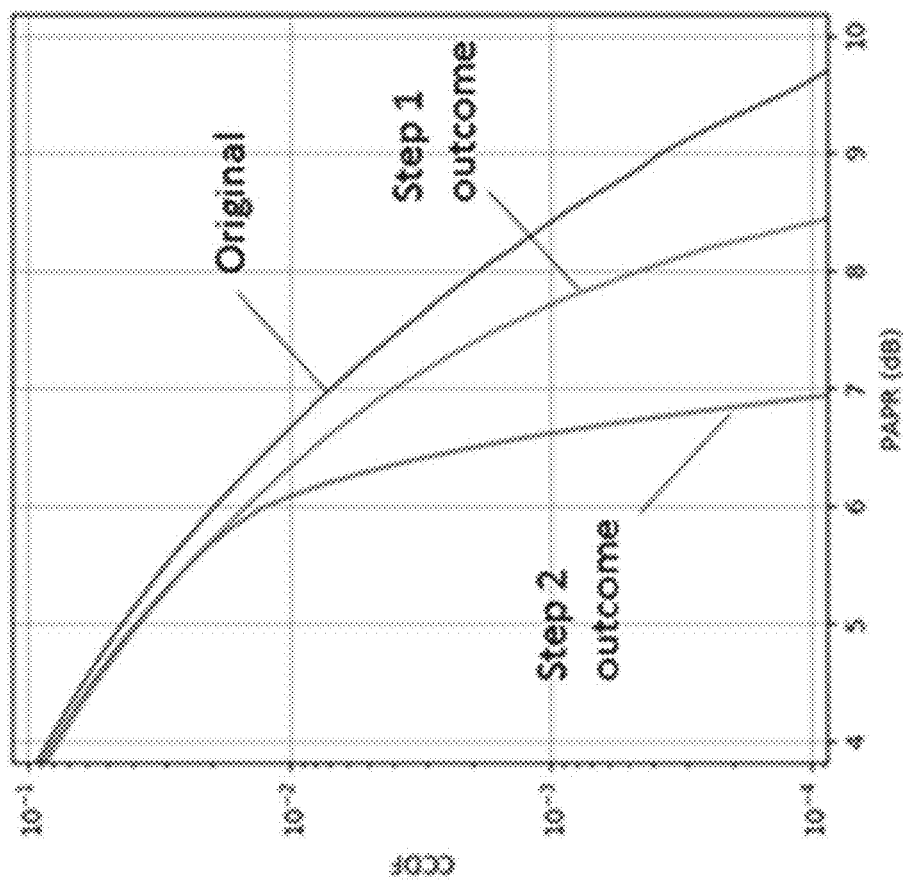
FIG. 9 illustrates a zoomed in portion of FIG. 8 to show more details, according to some embodiments of the present disclosure.
Figure 9:
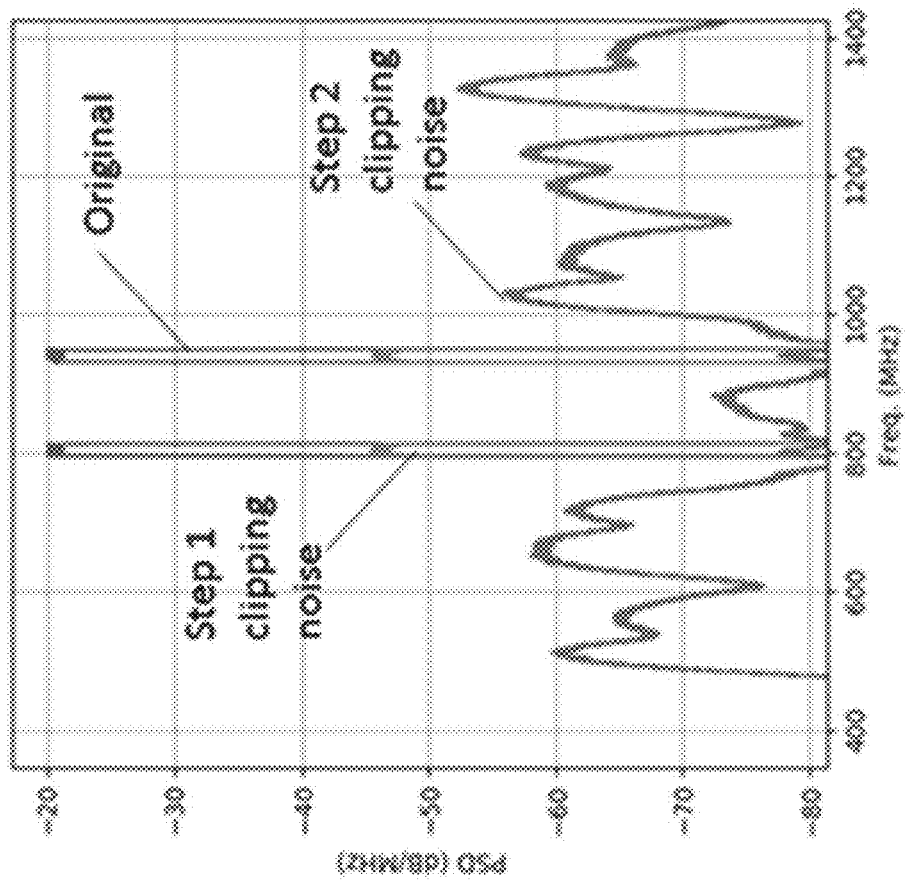

The original signal, intermediate result after Step 1, and the final result after Step 2 are plotted in FIG. 8 (left-hand side) as Power Spectral Density (PSD) versus frequency and FIG. 8 (right-hand side) as Complementary Cumulative Distribution Function (CCDF) versus PAPR. A zoomed in portion of FIG. 8 is plotted in FIG. 9 to show more details. As can be observed from FIG. 8 (left-hand side) and FIG. 9 (left-hand side), the clipping noise in Step 1 is confined within channels (26 dB below the carrier power level, yielding an EVM of 5.0%) whereas the clipping noise in Step 2 is suppressed within all the operating bands (55 dB relative to the carrier (dBc) below).

From FIGS. 8 (right-hand side) and 9 (right-hand side), it is observed that the original signal has a PAPR of 9.6 dB at 10e-4 probability, whereas the PAPR of Step 1 and 2 outputs are 8.4 dB and 6.9 dB respectively.

With respect to computational complexity, the majority of it happens at Step 2, with the first/second iteration processing 70484/66078 samples above threshold per 0.5 ms LTE slot, i.e., 18.2/17.0 G Multiply-Accumulate Operations (MAC) per second. In contrast, a straightforward channel-filter implementation, assuming 127 taps Finite Impulse Response (FIR) channel filters at 30.72 MHz, would require 40640 taps at 9830.4 GHz (i.e., around 5.7 T MAC per second per iteration). Even worse, since the majority of clipping noise, which lies outside of the bands, would be removed by such a sharp channel filter, it would take many iterations to converge. Accordingly, in this example of practical importance, the proposed technique reduces the computational complexity by at least three orders of magnitude compared to a conventional channel-filter based CFR.

To summarize, the aforementioned example has demonstrated the proposed CFR applied on a 5-band LTE signal spanning over 2 GHz of bandwidth. The outcome is a PAPR reduction from 9.6 dB down to 6.9 dB. The EVM penalty is 5.0% and the Adjacent Channel Leakage Ratio (ACLR) is 55 dBc in the worst case. Computational complexity is approximately 35.2 G MAC/s.

Accordingly, the functionality, effectiveness, and advantages of the proposed CFR technique are validated.

Figure 10:
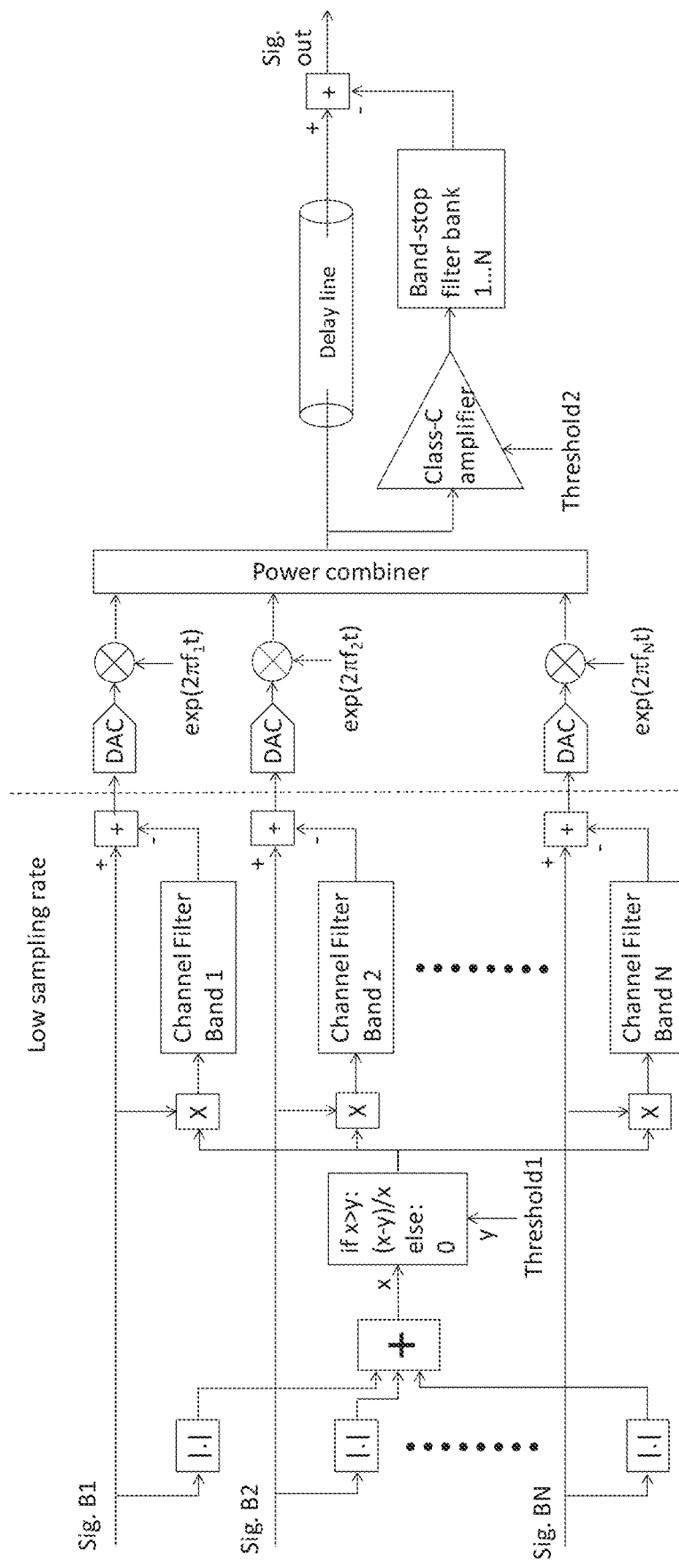
FIG. 10 illustrates a schematic block diagram that illustrates an example implementation of a transmitter, according to some embodiments of the present disclosure.

According to some embodiments, in situations when the bands are spaced far apart, the high sampling rate portion of the proposed technique requires a high sampling rate that is wider than the entire aggregated spectrum. In this case, it might be advantageous to implement the high-sampling-rate portion of the proposed method as an analog circuit as mentioned above. FIG. 10 illustrates an exemplary embodiment for doing this. As shown in FIG. 10, the DACs interface the low-sampling-rate digital circuit to an analog circuit. Within the analog circuit, frequency upconversions can be implemented as mixers and local oscillators. Signal summation can be implemented as a power combiner. Signal clipping above a certain threshold can be implemented, e.g., by an amplifier biased in Class-C. The band-stop filter bank can be implemented as analog filters, such as L-C filters, microwave transmission-line filters, or air-cavity filters.

Figure 11:
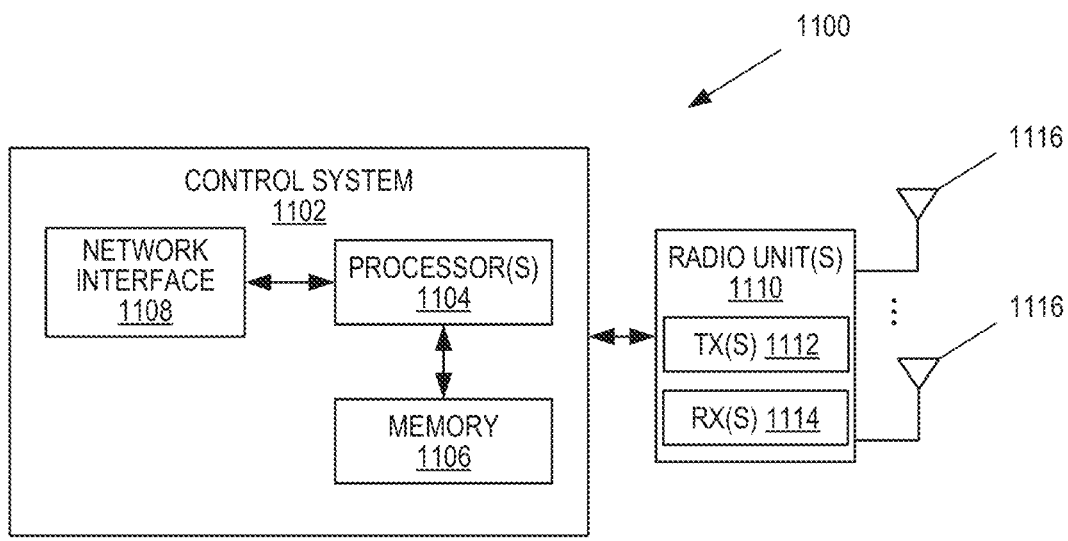
FIG. 11 illustrates a schematic block diagram of a radio access node, according to some other embodiments of the present disclosure.

FIG. 11 is a schematic block diagram of a radio access node 1100 according to some embodiments of the present disclosure. The radio access node 1100 may be, for example, a base station 102 or 106. As illustrated, the radio access node 1100 includes a control system 1102 that includes one or more processors 1104 (e.g., Central Processing Units (CPUs), Application Specific Integrated Circuits (ASICs), Field Programmable Gate Arrays (FPGAs), and/or the like), memory 1106, and a network interface 1108. The one or more processors 1104 are also referred to herein as processing circuitry. In addition, the radio access node 1100 includes one or more radio units 1110 that each includes one or more transmitters 1112 and one or more receivers 1114 coupled to one or more antennas 1116. The radio units 1110 may be referred to or be part of radio interface circuitry. In some embodiments, the radio unit(s) 1110 is external to the control system 1102 and connected to the control system 1102 via, e.g., a wired connection (e.g., an optical cable). However, in some other embodiments, the radio unit(s) 1110 and potentially the antenna(s) 1116 are integrated together with the control system 1102. The one or more processors 1104 operate to provide one or more functions of a radio access node 1100 as described herein. In some embodiments, the function(s) are implemented in software that is stored, e.g., in the memory 1106 and executed by the one or more processors 1104.

Figure 12:
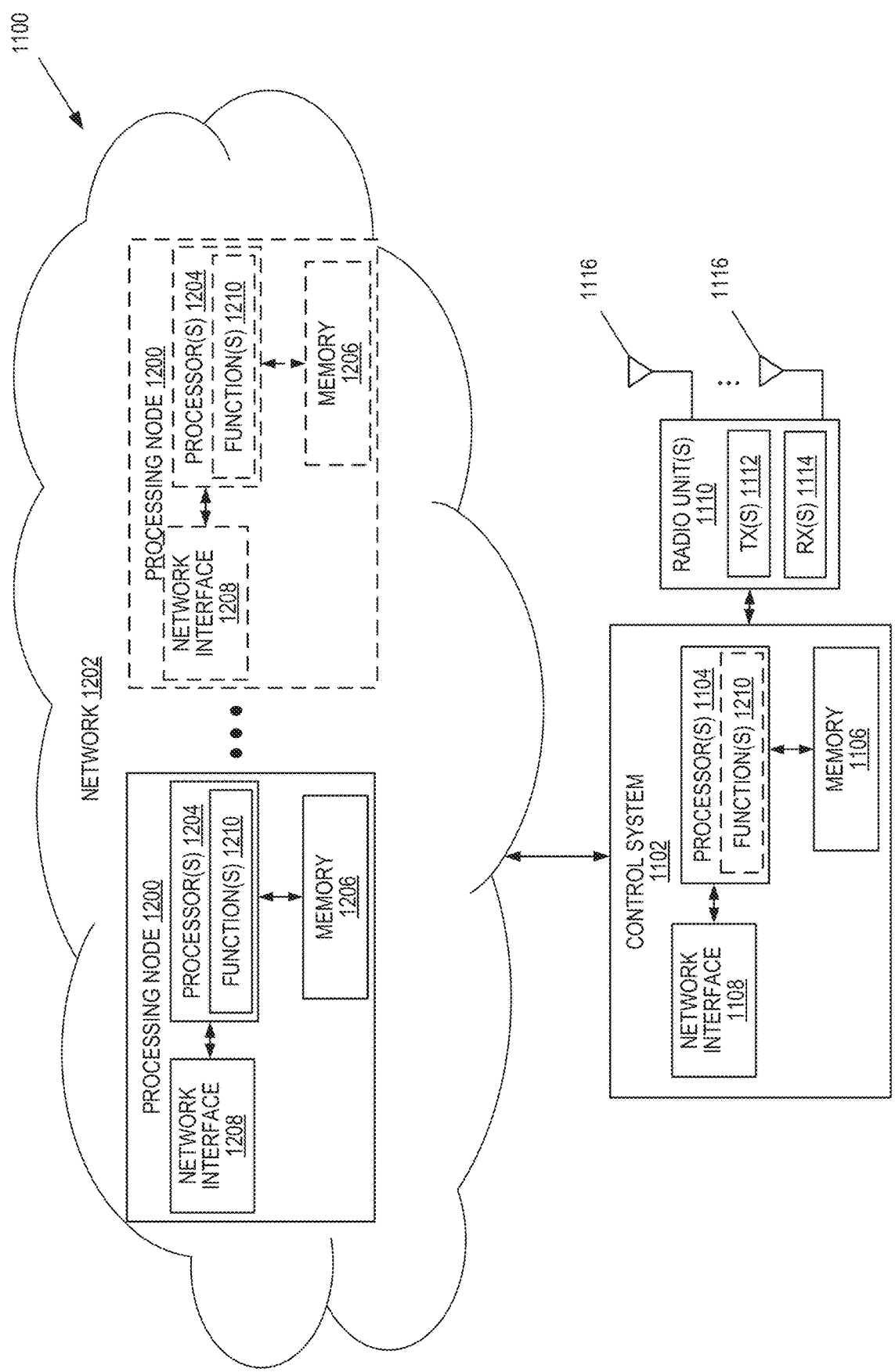
FIG. 12 illustrates a schematic block diagram that illustrates a virtualized embodiment of the radio access node, according to some embodiments of the present disclosure.

FIG. 12 is a schematic block diagram that illustrates a virtualized embodiment of the radio access node 1100 according to some embodiments of the present disclosure. This discussion is equally applicable to other types of network nodes. Further, other types of network nodes may have similar virtualized architectures.

As used herein, a "virtualized" radio access node is an implementation of the radio access node 1100 in which at least a portion of the functionality of the radio access node 1100 is implemented as a virtual component(s) (e.g., via a virtual machine(s) executing on a physical processing node(s) in a network(s)). As illustrated, in this example, the radio access node 1100 includes the control system 1102 that includes the one or more processors 1104 (e.g., CPUs, ASICs, FPGAs, and/or the like), the memory 1106, and the network interface 1108 and the one or more radio units 1110 that each includes the one or more transmitters 1112 and the one or more receivers 1114 coupled to the one or more antennas 1116, as described above. The control system 1102 is connected to the radio unit(s) 1110 via, for example, an optical cable or the like. The control system 1102 is connected to one or more processing nodes 1200 coupled to or included as part of a network(s) 1202 via the network interface 1108. Each processing node 1200 includes one or more processors 1204 (e.g., CPUs, ASICs, FPGAs, and/or the like), memory 1206, and a network interface 1208.

In this example, functions 1210 of the radio access node 1100 described herein are implemented at the one or more processing nodes 1200 or distributed across the control system 1102 and the one or more processing nodes 1200 in any desired manner. In some particular embodiments, some or all of the functions 1210 of the radio access node 1100 described herein are implemented as virtual components executed by one or more virtual machines implemented in a virtual environment(s) hosted by the processing node(s) 1200. As will be appreciated by one of ordinary skill in the art, additional signaling or communication between the processing node(s) 1200 and the control system 1102 is used in order to carry out at least some of the desired functions 1210. Notably, in some embodiments, the control system 1102 may not be included, in which case the radio unit(s) 1110 communicates directly with the processing node(s) 1200 via an appropriate network interface(s).

In some embodiments, a computer program including instructions which, when executed by at least one processor, causes the at least one processor to carry out the functionality of radio access node 1100 or a node (e.g., a processing node 1200) implementing one or more of the functions 1210 of the radio access node 1100 in a virtual environment according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 13:
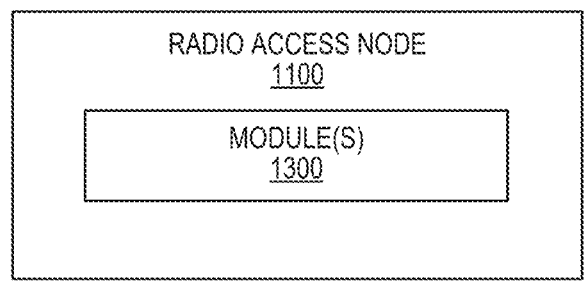
FIG. 13 illustrates a schematic block diagram of the radio access node, according to some embodiments of the present disclosure.

FIG. 13 is a schematic block diagram of the radio access node 1100 according to some other embodiments of the present disclosure. The radio access node 1100 includes one or more modules 1300, each of which is implemented in software. The module(s) 1300 provide the functionality of the radio access node 1100 described herein. This discussion is equally applicable to the processing node 1200 of FIG. 12 where the modules 1300 may be implemented at one of the processing nodes 1200 or distributed across multiple processing nodes 1200 and/or distributed across the processing node(s) 1200 and the control system 1102.

Figure 14:
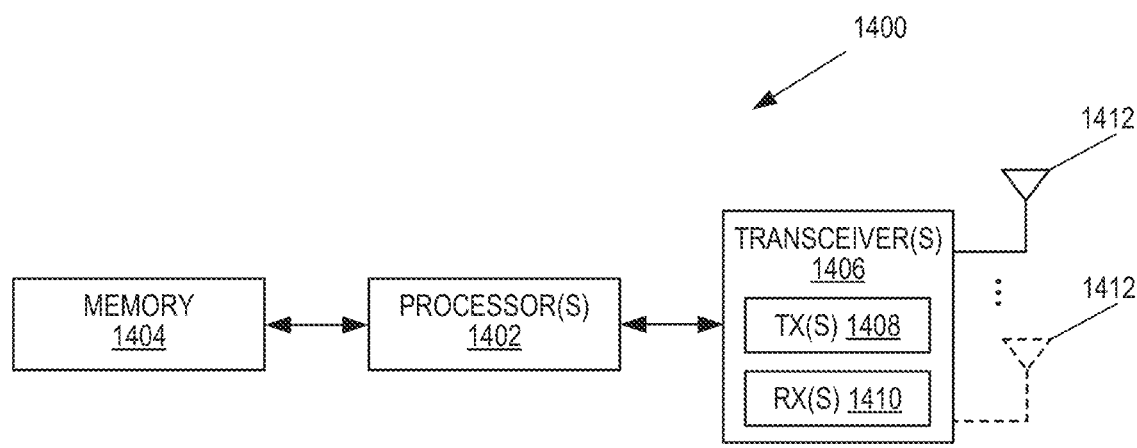
FIG. 14 illustrates a schematic block diagram of a UE, according to some embodiments of the present disclosure.

FIG. 14 is a schematic block diagram of a UE 1400 according to some embodiments of the present disclosure. As illustrated, the UE 1400 includes one or more processors 1402 (e.g., CPUs, ASICs, FPGAs, and/or the like), memory 1404, and one or more transceivers 1406 each including one or more transmitters 1408 and one or more receivers 1410 coupled to one or more antennas 1412. The transceiver(s) 1406 includes radio-front end circuitry connected to the antenna(s) 1412 that is configured to condition signals communicated between the antenna(s) 1412 and the processor(s) 1402, as will be appreciated by on of ordinary skill in the art. The processors 1402 are also referred to herein as processing circuitry. The transceivers 1406 are also referred to herein as radio circuitry. In some embodiments, the functionality of the UE 1400 described above may be fully or partially implemented in software that is, e.g., stored in the memory 1404 and executed by the processor(s) 1402. Note that the UE 1400 may include additional components not illustrated in FIG. 14 such as, e.g., one or more user interface components (e.g., an input/output interface including a display, buttons, a touch screen, a microphone, a speaker(s), and/or the like and/or any other components for allowing input of information into the UE 1400 and/or allowing output of information from the UE 1400), a power supply (e.g., a battery and associated power circuitry), etc.

In some embodiments, a computer program including instructions which, when executed by at least one processor, causes the at least one processor to carry out the functionality of the UE 1400 according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 15:
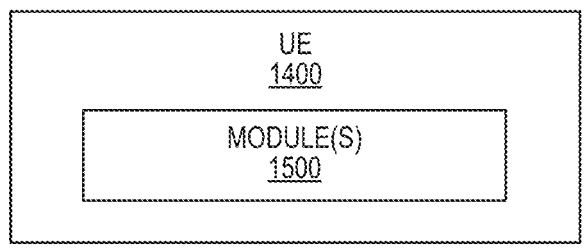
FIG. 15 illustrates a schematic block diagram of the UE, according to some embodiments of the present disclosure.

FIG. 15 is a schematic block diagram of the UE 1400 according to some other embodiments of the present disclosure. The UE 1400 includes one or more modules 1500, each of which is implemented in software. The module(s) 1500 provide the functionality of the UE 1400 described herein.

Figure 16:
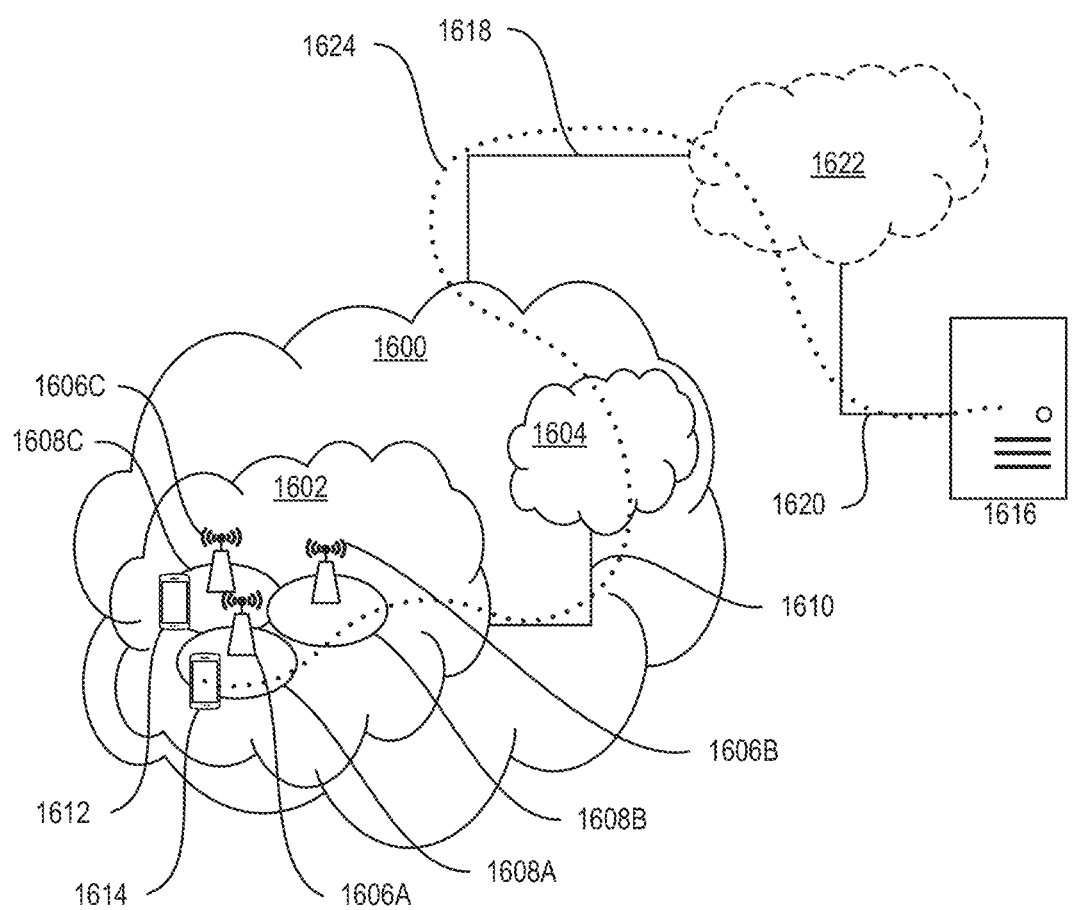
FIG. 16 illustrates a communication system that includes a telecommunication network, according to some embodiments of the present disclosure.

With reference to FIG. 16, in accordance with an embodiment, a communication system includes a telecommunication network 1600, such as a 3GPP-type cellular network, which comprises an access network 1602, such as a RAN, and a core network 1604. The access network 1602 comprises a plurality of base stations 1606A, 1606B, 1606C, such as NBs, eNBs, gNBs, or other types of wireless Access Points (APs), each defining a corresponding coverage area 1608A, 1608B, 1608C. Each base station 1606A, 1606B, 1606C is connectable to the core network 1604 over a wired or wireless connection 1610. A first UE 1612 located in coverage area 1608C is configured to wirelessly connect to, or be paged by, the corresponding base station 1606C. A second UE 1614 in coverage area 1608A is wirelessly connectable to the corresponding base station 1606A. While a plurality of UEs 1612, 1614 are illustrated in this example, the disclosed embodiments are equally applicable to a situation where a sole UE is in the coverage area or where a sole UE is connecting to the corresponding base station 1606.

The telecommunication network 1600 is itself connected to a host computer 1616, which may be embodied in the hardware and/or software of a standalone server, a cloud-implemented server, a distributed server, or as processing resources in a server farm. The host computer 1616 may be under the ownership or control of a service provider, or may be operated by the service provider or on behalf of the service provider. Connections 1618 and 1620 between the telecommunication network 1600 and the host computer 1616 may extend directly from the core network 1604 to the host computer 1616 or may go via an optional intermediate network 1622. The intermediate network 1622 may be one of, or a combination of more than one of, a public, private, or hosted network; the intermediate network 1622, if any, may be a backbone network or the Internet; in particular, the intermediate network 1622 may comprise two or more sub-networks (not shown).

The communication system of FIG. 16 as a whole enables connectivity between the connected UEs 1612, 1614 and the host computer 1616. The connectivity may be described as an Over-the-Top (OTT) connection 1624. The host computer 1616 and the connected UEs 1612, 1614 are configured to communicate data and/or signaling via the OTT connection 1624, using the access network 1602, the core network 1604, any intermediate network 1622, and possible further infrastructure (not shown) as intermediaries. The OTT connection 1624 may be transparent in the sense that the participating communication devices through which the OTT connection 1624 passes are unaware of routing of uplink and downlink communications. For example, the base station 1606 may not or need not be informed about the past routing of an incoming downlink communication with data originating from the host computer 1616 to be forwarded (e.g., handed over) to a connected UE 1612. Similarly, the base station 1606 need not be aware of the future routing of an outgoing uplink communication originating from the UE 1612 towards the host computer 1616.

Example implementations, in accordance with an embodiment, of the UE, base station, and host computer discussed in the preceding paragraphs will now be described with reference to FIG. 17. In a communication system 1700, a host computer 1702 comprises hardware 1704 including a communication interface 1706 configured to set up and maintain a wired or wireless connection with an interface of a different communication device of the communication system 1700. The host computer 1702 further comprises processing circuitry 1708, which may have storage and/or processing capabilities. In particular, the processing circuitry 1708 may comprise one or more programmable processors, ASICs, FPGAs, or combinations of these (not shown) adapted to execute instructions. The host computer 1702 further comprises software 1710, which is stored in or accessible by the host computer 1702 and executable by the processing circuitry 1708. The software 1710 includes a host application 1712. The host application 1712 may be operable to provide a service to a remote user, such as a UE 1714 connecting via an OTT connection 1716 terminating at the UE 1714 and the host computer 1702. In providing the service to the remote user, the host application 1712 may provide user data which is transmitted using the OTT connection 1716.

The communication system 1700 further includes a base station 1718 provided in a telecommunication system and comprising hardware 1720 enabling it to communicate with the host computer 1702 and with the UE 1714. The hardware 1720 may include a communication interface 1722 for setting up and maintaining a wired or wireless connection with an interface of a different communication device of the communication system 1700, as well as a radio interface 1724 for setting up and maintaining at least a wireless connection 1726 with the UE 1714 located in a coverage area (not shown in FIG. 17) served by the base station 1718. The communication interface 1722 may be configured to facilitate a connection 1728 to the host computer 1702. The connection 1728 may be direct or it may pass through a core network (not shown in FIG. 17) of the telecommunication system and/or through one or more intermediate networks outside the telecommunication system. In the embodiment shown, the hardware 1720 of the base station 1718 further includes processing circuitry 1730, which may comprise one or more programmable processors, ASICs, FPGAs, or combinations of these (not shown) adapted to execute instructions. The base station 1718 further has software 1732 stored internally or accessible via an external connection.

The communication system 1700 further includes the UE 1714 already referred to. The UE's 1714 hardware 1734 may include a radio interface 1736 configured to set up and maintain a wireless connection 1726 with a base station serving a coverage area in which the UE 1714 is currently located. The hardware 1734 of the UE 1714 further includes processing circuitry 1738, which may comprise one or more programmable processors, ASICs, FPGAs, or combinations of these (not shown) adapted to execute instructions. The UE 1714 further comprises software 1740, which is stored in or accessible by the UE 1714 and executable by the processing circuitry 1738. The software 1740 includes a client application 1742. The client application 1742 may be operable to provide a service to a human or non-human user via the UE 1714, with the support of the host computer 1702. In the host computer 1702, the executing host application 1712 may communicate with the executing client application 1742 via the OTT connection 1716 terminating at the UE 1714 and the host computer 1702. In providing the service to the user, the client application 1742 may receive request data from the host application 1712 and provide user data in response to the request data. The OTT connection 1716 may transfer both the request data and the user data. The client application 1742 may interact with the user to generate the user data that it provides.

Figure 17:
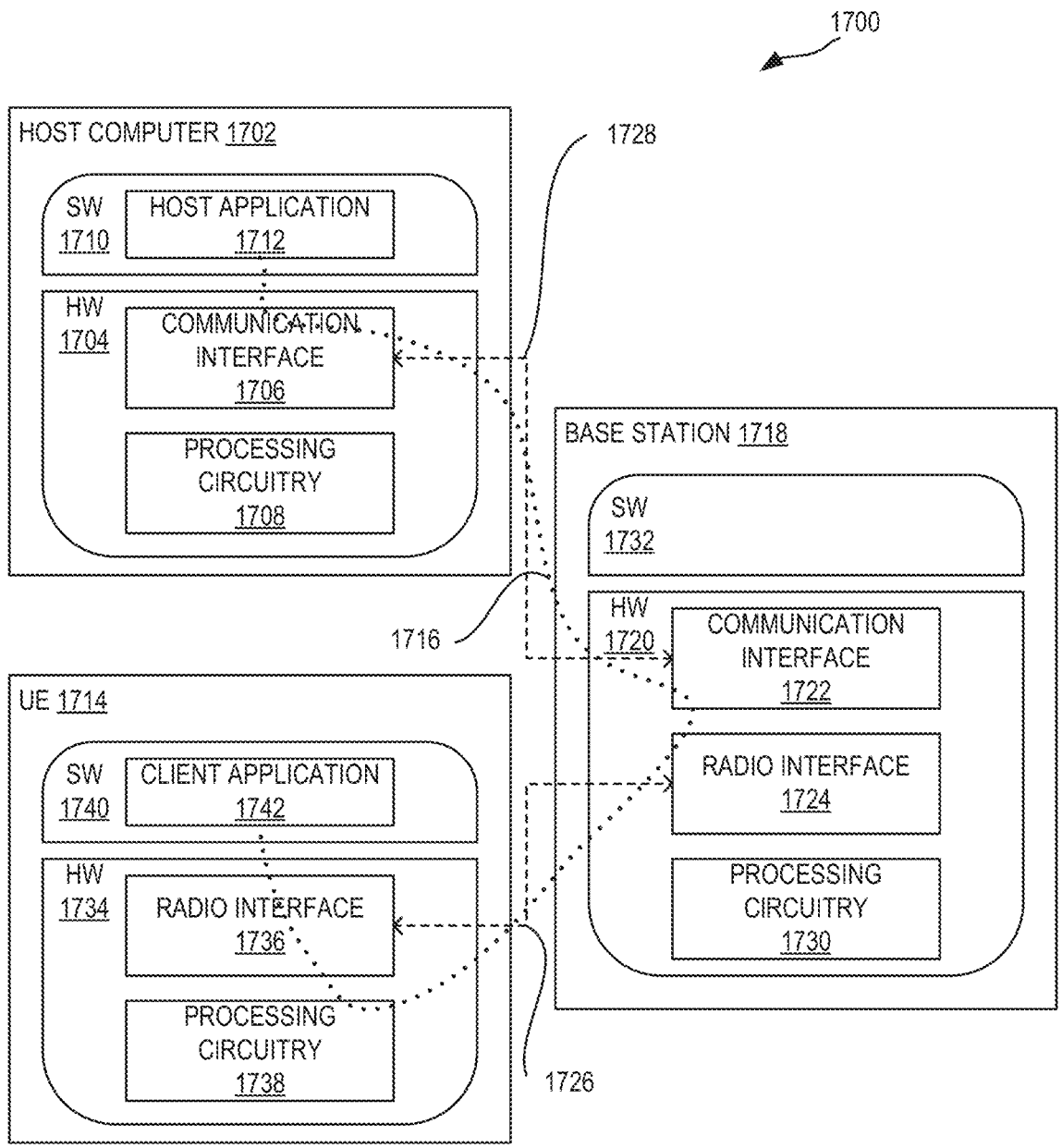
FIG. 17 illustrates additional details regarding the host computer, base station, and UE in the communication system of FIG. 16, according to some embodiments of the present disclosure.

It is noted that the host computer 1702, the base station 1718, and the UE 1714 illustrated in FIG. 17 may be similar or identical to the host computer 1616, one of the base stations 1606A, 1606B, 1606C, and one of the UEs 1612, 1614 of FIG. 16, respectively. This is to say, the inner workings of these entities may be as shown in FIG. 17 and independently, the surrounding network topology may be that of FIG. 16.

In FIG. 17, the OTT connection 1716 has been drawn abstractly to illustrate the communication between the host computer 1702 and the UE 1714 via the base station 1718 without explicit reference to any intermediary devices and the precise routing of messages via these devices. The network infrastructure may determine the routing, which may be configured to hide from the UE 1714 or from the service provider operating the host computer 1702, or both. While the OTT connection 1716 is active, the network infrastructure may further take decisions by which it dynamically changes the routing (e.g., on the basis of load balancing consideration or reconfiguration of the network).

The wireless connection 1726 between the UE 1714 and the base station 1718 is in accordance with the teachings of the embodiments described throughout this disclosure. One or more of the various embodiments improve the performance of OTT services provided to the UE 1714 using the OTT connection 1716, in which the wireless connection 1726 forms the last segment. More precisely, the teachings of these embodiments may improve the data rate, latency, and power consumption by reducing PAPR and allowing components of the transmitter to operate more linearly and/or more power efficiently and thereby provide benefits such as reduced user waiting time, relaxed restriction on file size, better responsiveness, and/or extended battery lifetime.

A measurement procedure may be provided for the purpose of monitoring data rate, latency, and other factors on which the one or more embodiments improve. There may further be an optional network functionality for reconfiguring the OTT connection 1716 between the host computer 1702 and the UE 1714, in response to variations in the measurement results. The measurement procedure and/or the network functionality for reconfiguring the OTT connection 1716 may be implemented in the software 1710 and the hardware 1704 of the host computer 1702 or in the software 1740 and the hardware 1734 of the UE 1714, or both. In some embodiments, sensors (not shown) may be deployed in or in association with communication devices through which the OTT connection 1716 passes; the sensors may participate in the measurement procedure by supplying values of the monitored quantities exemplified above, or supplying values of other physical quantities from which the software 1710, 1740 may compute or estimate the monitored quantities.

The reconfiguring of the OTT connection 1716 may include message format, retransmission settings, preferred routing, etc.; the reconfiguring need not affect the base station 1718, and it may be unknown or imperceptible to the base station 1718. Such procedures and functionalities may be known and practiced in the art. In certain embodiments, measurements may involve proprietary UE signaling facilitating the host computer 1702's measurements of throughput, propagation times, latency, and the like. The measurements may be implemented in that the software 1710 and 1740 causes messages to be transmitted, in particular empty or 'dummy' messages, using the OTT connection 1716 while it monitors propagation times, errors, etc.

Figures 18, 19:
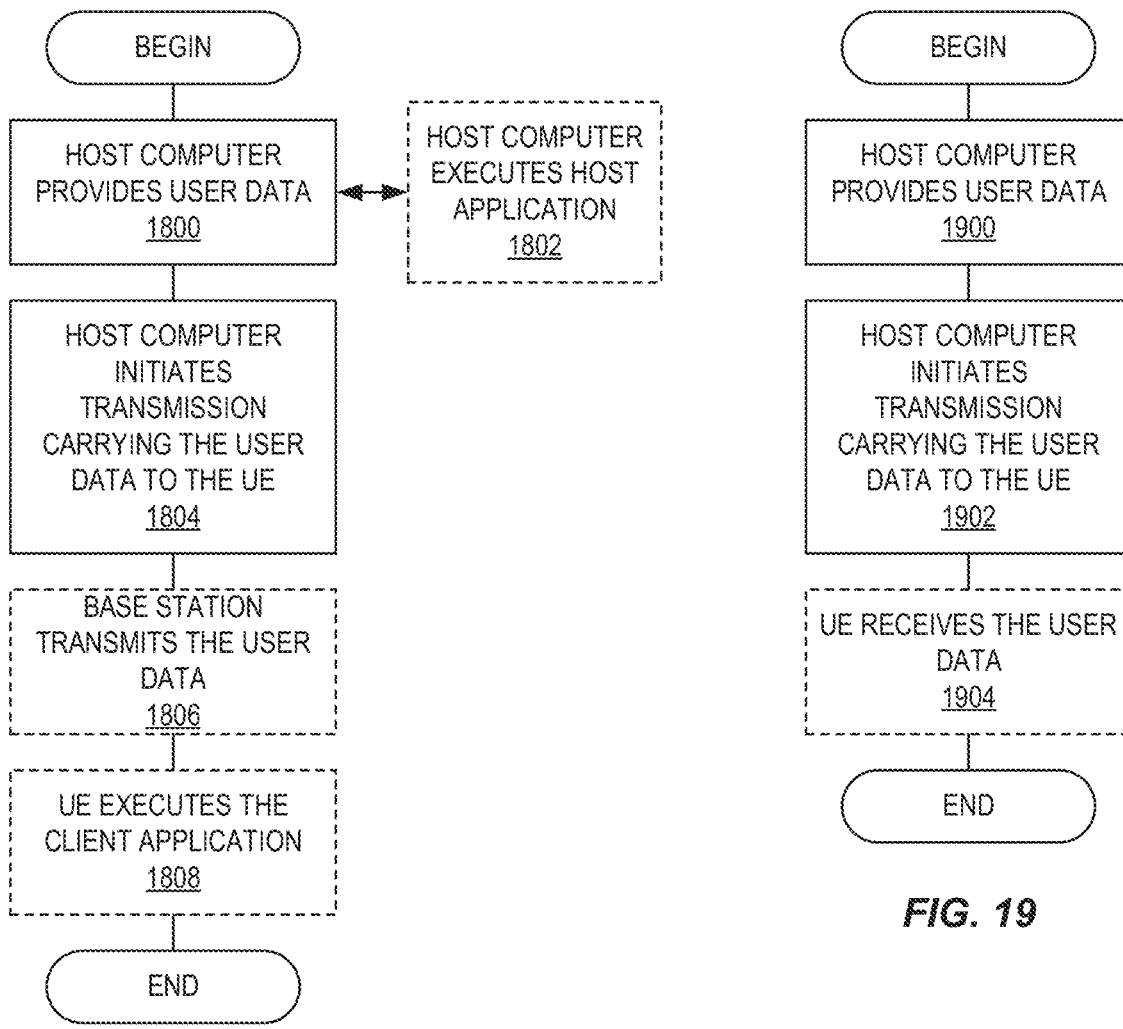

FIG. 18 is a flowchart illustrating a method implemented in a communication system, in accordance with one embodiment. The communication system includes a host computer, a base station, and a UE which may be those described with reference to FIGS. 16 and 17. For simplicity of the present disclosure, only drawing references to FIG. 18 will be included in this section. In step 1800, the host computer provides user data. In sub-step 1802 (which may be optional) of step 1800, the host computer provides the user data by executing a host application. In step 1804, the host computer initiates a transmission carrying the user data to the UE. In step 1806 (which may be optional), the base station transmits to the UE the user data which was carried in the transmission that the host computer initiated, in accordance with the teachings of the embodiments described throughout this disclosure. In step 1808 (which may also be optional), the UE executes a client application associated with the host application executed by the host computer.

FIG. 19 is a flowchart illustrating a method implemented in a communication system, in accordance with one embodiment. The communication system includes a host computer, a base station, and a UE which may be those described with reference to FIGS. 16 and 17. For simplicity of the present disclosure, only drawing references to FIG. 19 will be included in this section. In step 1900 of the method, the host computer provides user data. In an optional sub-step (not shown) the host computer provides the user data by executing a host application. In step 1902, the host computer initiates a transmission carrying the user data to the UE. The transmission may pass via the base station, in accordance with the teachings of the embodiments described throughout this disclosure. In step 1904 (which may be optional), the UE receives the user data carried in the transmission.

FIG. 20 is a flowchart illustrating a method implemented in a communication system, in accordance with one embodiment. The communication system includes a host computer, a base station, and a UE which may be those described with reference to FIGS. 16 and 17. For simplicity of the present disclosure, only drawing references to FIG. 20 will be included in this section. In step 2000 (which may be optional), the UE receives input data provided by the host computer. Additionally or alternatively, in step 2002 (which may be optional), the UE provides user data. In sub-step 2004 (which may be optional) of step 2000, the UE provides the user data by executing a client application. In sub-step 2006 (which may be optional) of step 2002, the UE executes a client application which provides the user data in reaction to the received input data provided by the host computer. In providing the user data, the executed client application may further consider user input received from the user. Regardless of the specific manner in which the user data was provided, the UE initiates, in sub-step 2008 (which may be optional), transmission of the user data to the host computer. In step 2010 of the method, the host computer receives the user data transmitted from the UE, in accordance with the teachings of the embodiments described throughout this disclosure.

FIG. 21 is a flowchart illustrating a method implemented in a communication system, in accordance with one embodiment. The communication system includes a host computer, a base station, and a UE which may be those described with reference to FIGS. 16 and 17. For simplicity of the present disclosure, only drawing references to FIG. 21 will be included in this section. In step 2100 (which may be optional), in accordance with the teachings of the embodiments described throughout this disclosure, the base station receives user data from the UE. In step 2102 (which may be optional), the base station initiates transmission of the received user data to the host computer. In step 2104 (which may be optional), the host computer receives the user data carried in the transmission initiated by the base station.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include Digital Signal Processor (DSPs), special-purpose digital logic, and the like. The processing circuitry may be configured to execute program code stored in memory, which may include one or several types of memory such as Read Only Memory (ROM), Random Access Memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

While processes in the figures may show a particular order of operations performed by certain embodiments of the present disclosure, it should be understood that such order is exemplary (e.g., alternative embodiments may perform the operations in a different order, combine certain operations, overlap certain operations, etc.).

Embodiments

Group A Embodiments

1. A method performed by a wireless device for performing Crest Factor Reduction, CFR, the method comprising:
    performing (400) a first CFR step on a plurality of input signals at a first sampling rate with joint peak detection and band-specific noise shaping; and
    performing (402) a second CFR step on the resulting plurality of input signals at a second sampling rate with joint peak detection and joint noise shaping where the second sampling rate is higher than the first sampling rate.

2. The method of embodiment 1 wherein performing band-specific noise shaping comprises using one or more band-pass channel-filter banks.

3. The method of any of embodiments 1 through 2 wherein performing joint noise shaping comprises using a band-stop filter bank.

4. The method of any of embodiments 1 through 3 further comprising:
digitally upconverting the resulting plurality of input signals at the first sampling rate to produce the resulting plurality of input signals at the second sampling rate.

5. The method of any of embodiments 1 through 4 wherein each of the plurality of input signals comprises one carrier signal or multiple closely spaced carrier signals.

6. The method of any of embodiments 1 through 5 wherein each of the plurality of input signals comprises a complex baseband signal of all carriers within a respective band.

7. The method of any of embodiments 1 through 6 wherein the second sampling rate is higher than the entire frequency range of operation.

8. The method of any of embodiments 2 through 7 wherein performing the first CFR step comprises:
obtaining (500) the plurality of input signals;
adding (502) an envelope amplitude of each of the plurality of input signals to obtain a sum;
comparing (504) the sum to a first threshold and, when the sum is greater than the first threshold, calculating a scaling factor based on the sum and the first threshold;
determining (506) a respective clipping noise for each of the plurality of input signals based on the scaling factor; and
filtering (508) the clipping noise for each of the plurality of input signals with a respective band-pass channel-filter bank.

9. The method of any of embodiments 3 through 8 wherein performing the second CFR step comprises:
obtaining (600) an instantaneous amplitude of a multi-band signal created by the plurality of input signals;
comparing (602) the instantaneous amplitude to a second threshold and, when the instantaneous amplitude is greater than the second threshold, calculating an excess factor based on the instantaneous amplitude and the second threshold;
determining (604) a multi-band clipping noise based on the excess factor; and
filtering (606) the multi-band clipping noise with a band-stop filter bank.

10. The method of any of the previous embodiments, further comprising:
providing user data; and
forwarding the user data to a host computer via a transmission to a base station.

Group B Embodiments

11. A method performed by a base station for performing Crest Factor Reduction, CFR, the method comprising:
performing (400) a first CFR step on a plurality of input signals at a first sampling rate with joint peak detection and band-specific noise shaping; and
performing (402) a second CFR step on the resulting plurality of input signals at a second sampling rate with joint peak detection and joint noise shaping where the second sampling rate is higher than the first sampling rate.

12. The method of embodiment 11 wherein performing band-specific noise shaping comprises using one or more band-pass channel-filter banks.

13. The method of any of embodiments 11 through 12 wherein performing joint noise shaping comprises using a band-stop filter bank.

14. The method of any of embodiments 11 through 13 further comprising:
digitally upconverting the resulting plurality of input signals at the first sampling rate to produce the resulting plurality of input signals at the second sampling rate.

15. The method of any of embodiments 11 through 14 wherein each of the plurality of input signals comprises one carrier signal or multiple closely spaced carrier signals.

16. The method of any of embodiments 11 through 15 wherein each of the plurality of input signals comprises a complex baseband signal of all carriers within a respective band.

17. The method of any of embodiments 11 through 16 wherein the second sampling rate is higher than the entire frequency range of operation.

18. The method of any of embodiments 12 through 17 wherein performing the first CFR step comprises:
obtaining (500) the plurality of input signals;
adding (502) an envelope amplitude of each of the plurality of input signals to obtain a sum;
comparing (504) the sum to a first threshold and, when the sum is greater than the first threshold, calculating a scaling factor based on the sum and the first threshold;
determining (506) a respective clipping noise for each of the plurality of input signals based on the scaling factor; and
filtering (508) the clipping noise for each of the plurality of input signals with a respective band-pass channel-filter bank.

19. The method of any of embodiments 13 through 18 wherein performing the second CFR step comprises:
obtaining (600) an instantaneous amplitude of a multi-band signal created by the plurality of input signals;
comparing (602) the instantaneous amplitude to a second threshold and, when the instantaneous amplitude is greater than the second threshold, calculating an excess factor based on the instantaneous amplitude and the second threshold;
determining (604) a multi-band clipping noise based on the excess factor; and
filtering (606) the multi-band clipping noise with a band-stop filter bank.

20. The method of any of the previous embodiments, further comprising:
obtaining user data; and
forwarding the user data to a host computer or a wireless device.

Group C Embodiments

21. A wireless device for performing Crest Factor Reduction, CFR, the wireless device comprising:
processing circuitry configured to perform any of the steps of any of the Group A embodiments; and
power supply circuitry configured to supply power to the wireless device.

22. A base station for performing Crest Factor Reduction, CFR, the base station comprising:
processing circuitry configured to perform any of the steps of any of the Group B embodiments; and power supply circuitry configured to supply power to the base station.

23. A User Equipment, UE, for performing Crest Factor Reduction, CFR, the UE comprising:
an antenna configured to send and receive wireless signals;
radio front-end circuitry connected to the antenna and to processing circuitry, and configured to condition signals communicated between the antenna and the processing circuitry;
the processing circuitry being configured to perform any of the steps of any of the Group A embodiments;
an input interface connected to the processing circuitry and configured to allow input of information into the UE to be processed by the processing circuitry;
an output interface connected to the processing circuitry and configured to output information from the UE that has been processed by the processing circuitry; and
a battery connected to the processing circuitry and configured to supply power to the UE.

24. A communication system including a host computer comprising:
processing circuitry configured to provide user data; and
a communication interface configured to forward the user data to a cellular network for transmission to a User Equipment, UE;
wherein the cellular network comprises a base station having a radio interface and processing circuitry, the base station's processing circuitry configured to perform any of the steps of any of the Group B embodiments.

25. The communication system of the previous embodiment further including the base station.

26. The communication system of the previous 2 embodiments, further including the UE, wherein the UE is configured to communicate with the base station.

27. The communication system of the previous 3 embodiments, wherein:
the processing circuitry of the host computer is configured to execute a host application, thereby providing the user data; and
the UE comprises processing circuitry configured to execute a client application associated with the host application.

28. A method implemented in a communication system including a host computer, a base station, and a User Equipment, UE, the method comprising:
at the host computer, providing user data; and
at the host computer, initiating a transmission carrying the user data to the UE via a cellular network comprising the base station, wherein the base station performs any of the steps of any of the Group B embodiments.

29. The method of the previous embodiment, further comprising, at the base station, transmitting the user data.

30. The method of the previous 2 embodiments, wherein the user data is provided at the host computer by executing a host application, the method further comprising, at the UE, executing a client application associated with the host application.

31. A User Equipment, UE, configured to communicate with a base station, the UE comprising a radio interface and processing circuitry configured to perform the method of the previous 3 embodiments.

32. A communication system including a host computer comprising:
processing circuitry configured to provide user data; and
a communication interface configured to forward user data to a cellular network for transmission to a User Equipment, UE;
wherein the UE comprises a radio interface and processing circuitry, the UE's components configured to perform any of the steps of any of the Group A embodiments.

33. The communication system of the previous embodiment, wherein the cellular network further includes a base station configured to communicate with the UE.

34. The communication system of the previous 2 embodiments, wherein:
the processing circuitry of the host computer is configured to execute a host application, thereby providing the user data; and
the UE's processing circuitry is configured to execute a client application associated with the host application.

35. A method implemented in a communication system including a host computer, a base station, and a User Equipment, UE, the method comprising:
at the host computer, providing user data; and
at the host computer, initiating a transmission carrying the user data to the UE via a cellular network comprising the base station, wherein the UE performs any of the steps of any of the Group A embodiments.

36. The method of the previous embodiment, further comprising at the UE, receiving the user data from the base station.

37. A communication system including a host computer comprising:
communication interface configured to receive user data originating from a transmission from a User Equipment, UE, to a base station;
wherein the UE comprises a radio interface and processing circuitry, the UE's processing circuitry configured to perform any of the steps of any of the Group A embodiments.

38. The communication system of the previous embodiment, further including the UE.

39. The communication system of the previous 2 embodiments, further including the base station, wherein the base station comprises a radio interface configured to communicate with the UE and a communication interface configured to forward to the host computer the user data carried by a transmission from the UE to the base station.

40. The communication system of the previous 3 embodiments, wherein:
the processing circuitry of the host computer is configured to execute a host application; and
the UE's processing circuitry is configured to execute a client application associated with the host application, thereby providing the user data.

41. The communication system of the previous 4 embodiments, wherein:
the processing circuitry of the host computer is configured to execute a host application, thereby providing request data; and
the UE's processing circuitry is configured to execute a client application associated with the host application, thereby providing the user data in response to the request data.

42. A method implemented in a communication system including a host computer, a base station, and a User Equipment, UE, the method comprising:

at the host computer, receiving user data transmitted to the base station from the UE, wherein the UE performs any of the steps of any of the Group A embodiments.

43. The method of the previous embodiment, further comprising, at the UE, providing the user data to the base station.

44. The method of the previous 2 embodiments, further comprising:
   at the UE, executing a client application, thereby providing the user data to be transmitted; and
   at the host computer, executing a host application associated with the client application.

45. The method of the previous 3 embodiments, further comprising:
   at the UE, executing a client application; and
   at the UE, receiving input data to the client application, the input data being provided at the host computer by executing a host application associated with the client application;
   wherein the user data to be transmitted is provided by the client application in response to the input data.

46. A communication system including a host computer comprising a communication interface configured to receive user data originating from a transmission from a User Equipment, UE, to a base station, wherein the base station comprises a radio interface and processing circuitry, the base station's processing circuitry configured to perform any of the steps of any of the Group B embodiments.

47. The communication system of the previous embodiment further including the base station.

48. The communication system of the previous 2 embodiments, further including the UE, wherein the UE is configured to communicate with the base station.

49. The communication system of the previous 3 embodiments, wherein:
   the processing circuitry of the host computer is configured to execute a host application; and
   the UE is configured to execute a client application associated with the host application, thereby providing the user data to be received by the host computer.

50. A method implemented in a communication system including a host computer, a base station, and a User Equipment, UE, the method comprising:
   at the host computer, receiving, from the base station, user data originating from a transmission which the base station has received from the UE, wherein the UE performs any of the steps of any of the Group A embodiments.

51. The method of the previous embodiment, further comprising at the base station, receiving the user data from the UE.

52. The method of the previous 2 embodiments, further comprising at the base station, initiating a transmission of the received user data to the host computer.

At least some of the following abbreviations may be used in this disclosure. If there is an inconsistency between abbreviations, preference should be given to how it is used above. If listed multiple times below, the first listing should be preferred over any subsequent listing(s).

3GPP Third Generation Partnership Project
4G Fourth Generation
5G Fifth Generation
ACLR Adjacent Channel Leakage Ratio
AP Access Point
ASIC Application Specific Integrated Circuit
CCDF Complementary Cumulative Distribution Function
CFR Crest Factor Reduction
CPU Central Processing Unit
DAC Digital-to-Analog Converter
dB Decibel
dBc Decibels relative to the carrier
DPD Digital Predistortion
DSP Digital Signal Processor
DUC Digital Upconversion
eNB Enhanced or Evolved Node B
EVM Error Vector Magnitude
FDD Frequency Division Duplexing
FIR Finite Impulse Response
FPGA Field Programmable Gate Array
GHz Gigahertz
gNB New Radio Base Station
Hz Hertz
IBW Instantaneous Bandwidth
ITS In the Sky
kHz Kilohertz
LTE Long Term Evolution
MAC Multiply-Accumulate Operation
MHz Megahertz
MME Mobility Management Entity
ms Millisecond
MS/s Mega Samples per Second
MTC Machine Type Communication
NR New Radio
OFDM Orthogonal Frequency Division Multiplexing
OTT Over-the-Top
PA Power Amplifier
PAPR Peak-to-Average Power Ratio
P-GW Packet Data Network Gateway
PSD Power Spectral Density
RAM Random Access Memory
RAN Radio Access Network
RBS Radio Base Station
RF Radio Frequency
ROM Read Only Memory
RRH Remote Radio Head
s Second
SCEF Service Capability Exposure Function
UE User Equipment Those skilled in the art will recognize improvements and modifications to the embodiments of the present disclosure. All such improvements and modifications are considered within the scope of the concepts disclosed herein.

What is claimed is:

1. A method performed by a wireless node for performing Crest Factor Reduction, CFR, the method comprising:
   performing a first CFR step on a plurality of input signals at a first sampling rate with joint peak detection and band-specific noise shaping by using one or more band-pass channel-filter banks; and
   performing a second CFR step on the resulting plurality of input signals at a second sampling rate with joint peak detection and joint noise shaping by using a band-stop filter bank, where the second sampling rate is higher than the first sampling rate.

2. The method of claim 1 further comprising:
   digitally upconverting the resulting plurality of input signals at the first sampling rate to produce the resulting plurality of input signals at the second sampling rate.

3. The method of claim 1 wherein each of the plurality of input signals comprises one carrier signal or multiple closely spaced carrier signals.

4. The method of claim 3 wherein each of the multiple closely spaced carrier signals are at most 100 megahertz, MHz, away from a next closest carrier signal.

5. The method of claim 1 wherein each of the plurality of input signals comprises a complex baseband signal of all carriers within a respective band.

6. The method of claim 1 wherein the second sampling rate is higher than an entire frequency range of operation.

7. The method of claim 1 wherein performing the first CFR step comprises:
obtaining the plurality of input signals;
adding an envelope amplitude of each of the plurality of input signals to obtain a sum;
comparing the sum to a first threshold and, when the sum is greater than the first threshold, calculating a scaling factor based on the sum and the first threshold;
determining a respective clipping noise for each of the plurality of input signals based on the scaling factor; and
filtering the clipping noise for each of the plurality of input signals with a respective band-pass channel-filter band.

8. The method of claim 7 wherein performing the first CFR step further comprises:
adding the filtered clipping noise for each of the plurality of input signals to the plurality of input signals to produce the resulting plurality of input signals.

9. The method of claim 1 wherein performing the second CFR step comprises:
obtaining an instantaneous amplitude of a multi-band signal created by the plurality of input signals;
comparing the instantaneous amplitude to a second threshold and, when the instantaneous amplitude is greater than the second threshold, calculating an excess factor based on the instantaneous amplitude and the second threshold;
determining a multi-band clipping noise based on the excess factor; and
filtering the multi-band clipping noise with a band-stop filter bank.

10. The method of claim 9 wherein performing the second CFR step further comprises:
adding the filtered multi-band clipping noise to the multi-band signal to produce the resulting multi-band signal.

11. The method of claim 1 wherein the wireless node is selected from the group consisting of:
a base station;
a relay node;
an In-the-Sky, ITS, radio access node; and
a wireless device.

12. A wireless node for performing Crest Factor Reduction, CFR, the wireless node comprising at least one processor and memory comprising instructions executable by the at least one processor whereby the wireless node is operable to:
perform a first CFR step on a plurality of input signals at a first sampling rate with joint peak detection and band-specific noise shaping by using one or more band-pass channel-filter banks; and
perform a second CFR step on the resulting plurality of input signals at a second sampling rate with joint peak detection and joint noise shaping by using a band-stop filter bank, where the second sampling rate is higher than the first sampling rate.

13. The wireless node of claim 12 further operable to:
digitally upconvert the resulting plurality of input signals at the first sampling rate to produce the resulting plurality of input signals at the second sampling rate.

14. The wireless node of claim 12 wherein each of the plurality of input signals comprises one carrier signal or multiple closely spaced carrier signals.

15. The wireless node of claim 14 wherein each of the multiple closely spaced carrier signals are at most 100 megahertz, MHz, away from a next closest carrier signal.

16. The wireless node of claim 12 wherein each of the plurality of input signals comprises a complex baseband signal of all carriers within a respective band.

* * * * *

UNITED STATES PATENT AND TRADEMARK OFFICE
CERTIFICATE OF CORRECTION

PATENT NO. : 11,438,205 B2
APPLICATION NO. : 17/052330
DATED : September 6, 2022
INVENTOR(S) : Hou et al.

It is certified that error appears in the above-identified patent and that said Letters Patent is hereby corrected as shown below:

In the Claims

In Column 25, Line 20, Claim 7, delete "band." and insert -- bank. --, therefor.

Signed and Sealed this
Fourteenth Day of February, 2023

Katherine Kelly Vidal
*Director of the United States Patent and Trademark Office*